(12) United States Patent
Kenyon et al.

(10) Patent No.: US 11,031,551 B2
(45) Date of Patent: Jun. 8, 2021

(54) LIGHT-ACTIVATED SWITCHING RESISTOR, AN OPTICAL SENSOR INCORPORATING A LIGHT-ACTIVATED SWITCHING RESISTOR, AND METHODS OF USING SUCH DEVICES

(71) Applicant: UCL Business PLC, London (GB)

(72) Inventors: Anthony J. Kenyon, London (GB); Adnan Mehonic, London (GB)

(73) Assignee: UCL BUSINESS LTD, London (GB)

( * ) Notice: Subject to any disclaimer, the term of this patent is extended or adjusted under 35 U.S.C. 154(b) by 0 days.

(21) Appl. No.: 16/631,678

(22) PCT Filed: Jul. 17, 2018

(86) PCT No.: PCT/GB2018/052024
§ 371 (c)(1),
(2) Date: Jan. 16, 2020

(87) PCT Pub. No.: WO2019/016539
PCT Pub. Date: Jan. 24, 2019

(65) Prior Publication Data
US 2020/0168793 A1    May 28, 2020

(30) Foreign Application Priority Data

Jul. 17, 2017 (GB) .................................... 1711439

(51) Int. Cl.
*H01L 45/00* (2006.01)
*G11C 13/00* (2006.01)

(52) U.S. Cl.
CPC ...... *H01L 45/1213* (2013.01); *G11C 13/0002* (2013.01); *G11C 13/0007* (2013.01);
(Continued)

(58) Field of Classification Search
CPC ............. H01L 45/1213; H01L 45/1253; H01L 45/145; H01L 45/08; G11C 13/0007;
(Continued)

(56) References Cited

U.S. PATENT DOCUMENTS 8,320,154 B2 * 11/2012 Hasegawa ........... H01L 51/4206
365/113
8,546,898 B2 * 10/2013 Thylen .................. G11C 7/005
257/431

(Continued)

FOREIGN PATENT DOCUMENTS

WO    WO 2011/053297    5/2011
WO    WO 2013/005040    1/2013

(Continued)

OTHER PUBLICATIONS

International Search Report and Written Opinion for Int'l Application No. PCT/GB2018/052024, titled: A Light-Activated Switching Resistor, an Optical Sensor Incorporating a Light-Activated Switching Resistor, and Methods of Using Such Devices, dated Sep. 28, 2018.

(Continued)

*Primary Examiner* — Fernando Hidalgo
(74) *Attorney, Agent, or Firm* — Hamilton, Brook, Smith & Reynolds, P.C.

(57) ABSTRACT

A switching resistor comprises a dielectric layer disposed between a first electrode layer and a second electrode layer, the switching resistor having a high resistance state and a low resistance state. The switching resistor is responsive to a voltage bias, applied between the first electrode layer and the second electrode layer, wherein the voltage bias exceeds a threshold to switch from the high resistance state to the low resistance state. The switching resistor is sensitive to photo-illumination to reduce said threshold.

15 Claims, 12 Drawing Sheets

(52) U.S. Cl.
CPC ...... *G11C 13/0069* (2013.01); *H01L 45/1253* (2013.01); *H01L 45/145* (2013.01); *G11C 2213/33* (2013.01)

(58) Field of Classification Search
CPC ............ G11C 13/0069; G11C 2213/33; G11C 13/0002; G11C 13/047; G11C 13/0009; G11C 13/0011; G11C 13/04
USPC ........................................................ 365/148
See application file for complete search history.

(56) References Cited

U.S. PATENT DOCUMENTS

| | | | |
|---|---|---|---|
| 10,269,860 | B2 * | 4/2019 | Ang ..................... G11C 13/047 |
| 2005/0180189 | A1 | 8/2005 | Happ et al. |
| 2006/0044991 | A1 | 3/2006 | Nishihara et al. |
| 2007/0138565 | A1 | 6/2007 | Datta et al. |
| 2011/0242873 | A1 | 10/2011 | Bratkovski et al. |
| 2013/0023105 | A1 | 1/2013 | Pramanik |
| 2015/0044816 | A1 | 2/2015 | Kim et al. |
| 2015/0162424 | A1 | 6/2015 | Briere |
| 2017/0032848 | A1 | 2/2017 | Chung et al. |
| 2017/0141306 | A1 | 5/2017 | Maikap et al. |
| 2020/0043550 | A1 | 2/2020 | Kenyon et al. |
| 2020/0144496 | A1 | 5/2020 | Glassman et al. |

FOREIGN PATENT DOCUMENTS

| | | |
|---|---|---|
| WO | WO 2017/018933 | 2/2017 |
| WO | WO 2017/115340 | 7/2017 |
| WO | WO 2018/178720 | 10/2018 |
| WO | WO 2019/016539 | 1/2019 |

OTHER PUBLICATIONS

International Preliminary Report on Patentability for Int'l Application No. PCT/GB2018/052024, titled: A Light-Activated Switching Resistor, an Optical Sensor Incorporating a Light-Activated Switching Resistor, and Methods of Using Such Devices, dated Jan. 21, 2020.
Borghetti et al., ""Memristive" switches enable "stateful" logic operations via material implication," Nature, Letters, vol. 464, Apr. 8, 2010, pp. 873-876.
Chang et al., "Characteristics and Mechanisms of Silicon-Oxide-Based Resistance Random Access Memory," IEEE Electron Device Letters, vol. 34, No. 3, Mar. 2013, pp. 399-401.
Chen et al., "Comprehensive study of intrinsic unipolar SiOx-based ReRAM characteristics in AC frequency response and low voltage (< 2V) operation," 2016 International Symposium on VLSI Technology, Systems and Application (VLSI-TSA), IEEE, pp. 1-2 (Apr. 25, 2016).
Chen et al., "HfOx Based Vertical Resistive Random Access Memory for Cost-Effective 3D Cross-Point Architecture without Cell Selector," IEEE, 4 pages (2012).
Choi et al., "Electrical Performance and Scalability of Pt Dispersed SiO2 Nanometallic Resistance Switch," Nano Lett., 13: 3213-3217 (2013).
Di Bartolomeo, "Graphene Schottky diodes: An experimental review of the rectifying graphene/semiconductor heterojunction," Physics Reports 606, pp. 1-58 (2016).
Gao et al., "A mechanism for Frenkel defect creation in amorphous SiO2 facilitated by electron injection," Nanotechnology, 27, 2016, 505207, (7pp).
Hohl et al., "An interface clusters mixture model for the structure of amorphous silicon monoxide (SiO)," Journal of Non-Crystalline Solids, 320 (2003), pp. 255-280.
Jana et al., "Rough surface improved formation-free low power resistive switching memory using Ir0 x /Gd0 x /W structure," VLSI Technology, Systems and Applications, 2013 International Symposium, IEEE, pp. 1-2 (Apr. 22, 2013), XP032431000.

Jeong et al., "A low-temperature-grown Ti02-based device for the flexible stacked RRAM application," Nanotechnology, 21(11): 115203 (Mar. 19, 2010), XP020174657.
Jo et al., "Nanoscale Memristor Device as Synapse in Neuromorphic Systems," Nano Lett. 2010, 10, pp. 1297-1301.
Ke et al., "Surface-Controlled Metal Oxide Resistive Memory," IEEE Electron Device Letters, IEEE Service Center, New York, NY, vol. 36, No. 12, pp. 1307-1309 (Nov. 20, 2015), XP011590844.
Kvatinsky et al., "Memristor-Based Material Implication (IMPLY) Logic: Design Principles and Methodologies," IEEE Transactions on Very Large Scale Integration (Vlsi) Systems, pp. 1-15 (2013).
Lamb, D. R., "A non-filamentary switching action in thermally grown sillicon dioxide films," Brit. J. Appl. Phys., vol. 18., pp. 29-32 (1967).
Mehonic et al., "Emulating the Electrical Activity of the Neuron Using a Silicon Oxide RRAM cell," Frontiers in Neuroscience, Feb. 2016, vol. 10, Article 57, Feb. 23, 2016.
Mehonic et al., "Structural changes and conductance threshholds in metal-free intrinsic SiOx resistive random access memory," J. Appl. Phys., 117: 124505 (2015).
Mehonic et al., "Resistive switching in silicon suboxide films," Journal of Applied Physics, 111, 074507 (2012).
Mehonic et al., "Electrically tailored resistance switching in silicon oxide," Nanotechnology, 23: 455201: 1-9 (2012).
Mikhaylov et al., "Bipolar resistive switching and charge transport in silicon oxide memristor," Materials Science and Engineering B, 194 (2015) 48-54.
Montesi et al., "Nanosecond Analog Programming of Substoichiometric Silicon Oxide Resistive RAM," IEEE Transactions on Nanotechnology, IEEE Service Center, Piscataway, NY, vol. 15, No. 3, pp. 428-434 (May 6, 2016), XP011611857.
Pearson et al., "Filamentary Conduction in Semiconducting Glass Diodes," Appl. Phys. Lett. 14, No. 9, pp. 280-282 (1969).
Pennycook et al., "High-resolution Z-contrast imaging of crystals," Ultramicroscopy 37 (1991) 14-38, North-Holland.
Southwick, III et al., Stacked Dual-Oxide MOS Energy Band Diagram Visual Representation Program (IRW Student Paper), IEEE Transactions on Device and Materials Reliability, vol. 6, No. 2, pp. 136-145 (2006).
Southwick, III et al., "An Interactive Simulation Tool for Complex Multilayer Dielectric Devices," IEEE Transactions on Device and Materials Reliability, vol. 11, No. 2, (2011).
Strukov, "The missing memristor found," Nature vol. 453, pp. 81-83 (2008).
Sze et al., "Physics of Semiconductor Devices," Physics of Semiconductor Devices, 3rd Edition, pp. 1-763 (2007).
Tappertzhofen et al., "Nanoionic transport and electrochemical reactions in resistively switching silicon dioxide," Nanoscale, 4, pp. 3040-3043 (2012).
Thornton, "The microstructure of sputter-deposited coatings," Journal of Vacuum Science & Technology A 4 (6), Nov./Dec. 1986; https://doi.org/10.116/1.573628, 3059-3065.
Torrezan et al., "Sub-nanoseconf switching of a tantalum oxide memristor," Nanotechnology, 22 (2011) 485203 (7pp).
Tsai et al., "Origin of Hopping Conduction in Sn-Doped Silicon Oxide RRAM With Supercritical CO2 Fluid Treatment," IEEE Electron Device Letters, vol. 33, No. 12, pp. 1693-1695 (2012).
Vescan et al., "I/V characteristics of epitaxial Schottky Au barrier diode on p+ diamond substrate," Diamond and Related Materials, 4, pp. 661-665 (1995).
Wang, Y., et al., "Memory switching properties of e-beam evaporated SiOx on N++ Si substrate," Appl. Phys. Lett. 100, 083502 (2012).
Wang et al., "Nanoporous Silicon Oxide Memory," Nano Letters, 2014, 14, 4694-4699.
Waser et al., "Nanoionics-based resistive switching memories," Review Articles, Insight, Nature Materials, vol. 6, Nov. 2007, pp. 833-840.
Yan et al., "Superior resistive switching memory and biological synapse properties based on a simple TiN/SiO2/p—Si tunneling junction structure," Journal of Materials Chemistry C, 2017, 5, 2259-2267.

(56) References Cited

OTHER PUBLICATIONS

Yao et al., Resistive Switches and Memories from Silicon Oxide, Nano Letters, 2010, 10, 4105-4110.

Yco, K. S., et al., "Application of sputter-deposited amorphous and anatasc TiO2 as electron-collecting layers in inverted organic photovoltaics," Organic Electronics 14, pp. 1715-1719 (2013).

Tikhov et al., "Light-induced resistive switching in silicon-based metal-insulator-semiconductor structures," Technical Physics Letters, American Institute of Physics, New York, NY, vol. 42, No. 5, pp. 536-538 (Jun. 17, 2016), XP035983791.

Ungureanu et al, "A Light-Controlled Resistive Switching Memory," Advanced Materials, 24(18): 2496-2500 (May 8, 2012), XP055507843.

\* cited by examiner

LIGHT-ACTIVATED SWITCHING RESISTOR, AN OPTICAL SENSOR INCORPORATING A LIGHT-ACTIVATED SWITCHING RESISTOR, AND METHODS OF USING SUCH DEVICES

This application is the U.S. National Stage of International Application No. PCT/GB2018/052024, filed Jul. 17, 2018, which designates the U.S., published in English, and claims priority under 35 U.S.C. § 119 or 365(c) to Great Britain Application No. 1711439.8, filed Jul. 17, 2017. The entire teachings of the above applications are incorporated herein by reference.

FIELD

The present application relates to light-activated switching resistors, including optical sensors that incorporate such light-activated switching resistors, and to methods of using such devices.

BACKGROUND

As modern computing has expanded from desktop PCs and mainframes towards laptops and mobile devices, demand has increased for space and power efficient memory. Recent years have seen renewed interest and research into alternative memory technologies, with resistive random access memory (RRAM) standing as a leading candidate. The resistance of such devices depends on their past history, and typically can be switched between a lower value and a higher value (and back again). Moreover, such two-terminal resistive switching elements (known as switching resistors, memory resistors, or "memristors") have the ability to remember their last resistance state even when no bias voltage is applied and after power has been switched off. This behaviour opens up a wide range of potential applications including memories, and also other areas, such as logic and unconventional computing architectures. For example, a non-volatile device exploiting resistance switching, such as RRAM, offers the possibly of low power consumption, high speed switching and high density storage in 3D arrays [9]. Accordingly, non-volatile memories based on resistive (resistance) switching have attracted considerable attention over the past few years.

Switching resistors reported in the literature typically have multilayer structures in which conductive pathways are generated by the application of external fields. Strukov et al, [33], discloses that titanium dioxide multilayers, in which the spatial distribution of oxygen ions is altered by an applied field, have exhibited memristor behaviour.

Redox-based resistive RAM (ReRAM) [1] is viewed as one of the most promising candidates for the next-generation of non-volatile memories owing to its fast switching times, low power consumption, non-volatility and CMOS-compatibility [2, 3]. Other applications include power-efficient systems for neuromorphic engineering [4, 5] and logic [6].

Resistance switching can result from a number of different processes. These processes can be divided into two main categories: intrinsic and extrinsic. The former category represents properties of the oxide itself (e.g. valence change RRAM). The latter category involves inducing a reversible drift (diffusion) of one or more conductive species such as metal ions into an insulating material (or material of low conductivity) such as a metal oxide, semiconductor oxide, or semiconductor. This extrinsic switching generally uses the foreign metal ions to form and destroy conductive bridges across the insulating oxide layer [19-21].

The body of literature on intrinsic resistance switching in silicon oxide is rather more limited. Work in the 1960s showed that silicon oxide would undergo irreversible electrical breakdown [22-24]. However, there has been a conventional belief that sub-hard breakdown silicon oxide is an inert electrical insulator, and some literature has even suggested that resistance switching in metal-free silicon oxide is not possible [8].

Nevertheless, intrinsic switching has indeed been reported in silicon oxide, and using modern CMOS techniques, silicon oxide devices have been tuned to undergo reversible changes in resistance. This allows the devices to experience large, reversible changes in resistance, and so act as RRAM devices. These intrinsic switching devices are fully CMOS compatible, promising reduced manufacturing costs and ease of implementation.

An intrinsic resistance switching effect has been demonstrated on the surface of silicon oxide held under vacuum, see [12] and [25]. However, the vacuum requirement of these devices makes them somewhat unwieldy for practical use. More recently, another (and phenomenologically different) intrinsic switching effect has been demonstrated by [9], with the advantage of occurring in bulk silicon dioxide (silica) under ambient conditions. Accordingly, such intrinsic switching can generally can be classified into that occurring inside the oxide bulk ("bulk switching"), which may be influenced by the oxide microstructure and the availability of oxygen [9-11], while switching at internal pores and edges ("surface switching") of the oxide may only be possible in vacuum or in devices that have been hermetically sealed [12, 13]. Further information about intrinsic, bulk switching, and the electrical, chemical and structural properties of non-volatile silicon based RRAM cells, can be found, inter alia, in [9, 11, 18], and in WO 2013/005040.

The present application describes further enhancements of switching resistors.

SUMMARY

The invention is defined in the appended claims.

In some implementations, a switching resistor comprises a dielectric layer disposed between a first electrode layer and a second electrode layer, the switching resistor having a high resistance state and a low resistance state. The switching resistor is responsive to the application of a voltage bias, between the first electrode layer and the second electrode layer, which exceeds a threshold to trigger or activate a switch from the high resistance state to the low resistance state. The switching resistor is sensitive to photo-illumination to reduce said threshold.

In more general terms, the present application describes optically active switching resistors. Using data collected from an implementation of an example switching resistor, a model is presented to describe the optical activity of the switching resistor to transition between the high resistance state and the low resistance state.

It will be appreciated that features and aspects of the invention described herein for certain implementations may be combined as appropriate with features and aspects of other implementations described herein, without limitation or restriction to the specific combinations of features described herein.

BRIEF DESCRIPTION OF THE DRAWINGS

Various implementations of the invention will now be described, by way of example only, with reference to the accompanying drawings, in which.

DETAILED DESCRIPTION

Please note that aspects and features of apparatus and methods discussed herein which are not described in detail may be implemented in accordance with any conventional technique for implementing such aspects and features.

Figure 1:
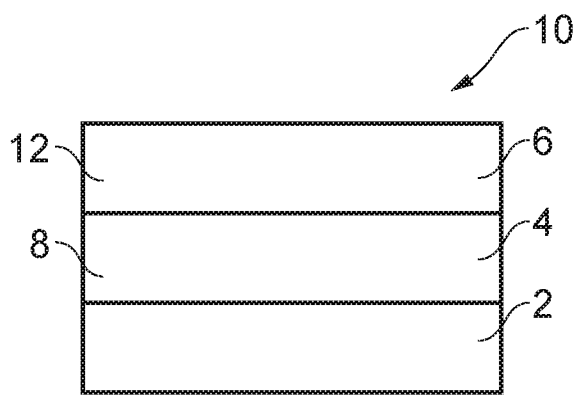
FIG. 1a) is a schematic cross-sectional diagram of a switching resistor as described herein in a pristine state.
FIG. 1b) is a schematic cross-sectional diagram of the switching resistor in a low resistance state.
FIG. 1c) is a schematic cross-sectional diagram of the switching resistor in a high resistance state.
Figure 1:
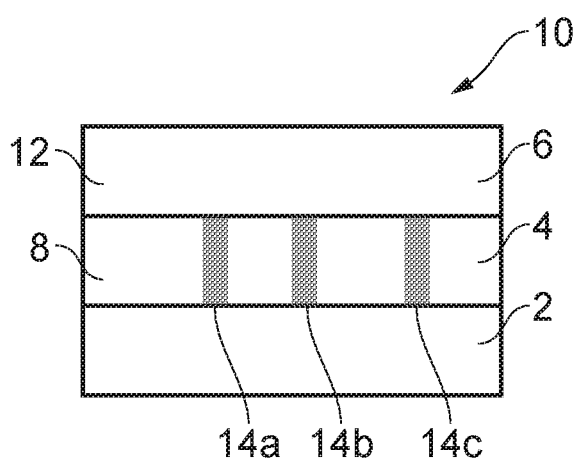
Figure 1:
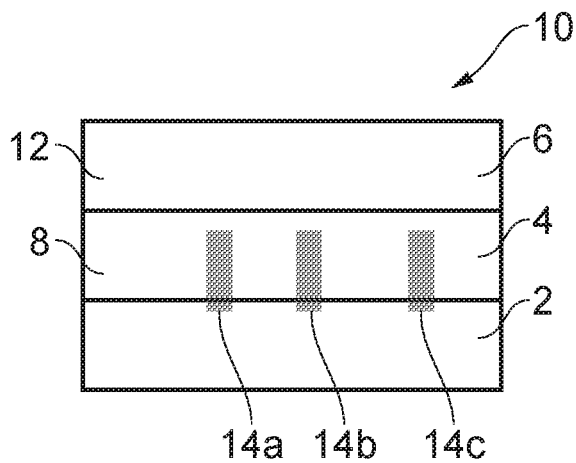

FIG. 1a shows a cross-section of an example switching resistor 10 in the pristine state. The switching resistor 10 comprises a first electrode (layer) 2, a dielectric layer 4 and a second electrode (layer) 6. There is a first boundary surface 8 between the first electrode 2 and the dielectric layer 4, and a second boundary surface 12 between the second electrode 6 and the dielectric layer 4. In a typical manufacturing process, the first electrode 2 acts as a base or substrate (although in other implementations, the first electrode 2 may be formed on a separate base or substrate). The dielectric layer 4 is then formed on the first electrode 2 by any suitable technique, e.g. sputtering, and the second electrode 6 is then formed on the dielectric layer 4. Accordingly, the first electrode 2 may be referred to herein as the lower or bottom electrode, and the second electrode 6 may be referred to herein as the upper or top electrode. In the pristine state, the resistance between the first and second electrodes is very high.

In some devices, the first electrode 2 and the second electrode 6 are formed from the same material—these are referred to as symmetric devices. In other devices, the first electrode 2 and the second electrode 6 are formed from different materials—these are referred to as asymmetric devices.

FIG. 1b shows a cross-section of the example switching resistor 10 after it has been switched to the low resistance states (LRS), also known as the on state. This switching can be achieved by providing electrical connections to the first and second electrodes and by applying an appropriate voltage bias between the two electrodes. The switching resistor transitions from the pristine state to the LRS, a process known as electroforming. The low resistance of the LRS is believed to occur due to the formation of one or more conductive filaments 14a, 14b, 14c in the dielectric layer 4 which extend between the first electrode 2 and the second electrode 6. (Although FIG. 1b illustrates three conductive filaments, it is believed that in some implementations at least, only a single conductive filament may form within the switching resistor 10).

FIG. 1c shows a cross-section of the switching resistor 10 after it has now transitioned to high resistance state (HRS), also known as the off state. Such a transition may be achieved by supplying a high level of current through the device. The HRS has a value of resistance intermediate that of the pristine state and the LRS. It is believed that in the HRS, the one or more conductive filaments from the LRS no longer extend fully from the first electrode 2 to the second electrode 6. For example, FIG. 1c shows schematically that the conductive filaments 14a, 14b, 14c no longer reach the upper or second electrode 6 (however, the location of the interruption for any given filament may vary according to the particular circumstances).

Switching between LRS and HRS states is well defined with a resistance contrast of typically 100 or more. The process of applying a voltage between the first electrode 2 and the second electrode 6 to switch the switching resistor from the HRS to the LRS is referred to as the 'set' process (i.e. to transition from off to on). Conversely, the process of applying a voltage between the first electrode 2 and the second electrode 6 to switch the switching resistor from the LRS to the HRS is referred to as the 'reset' process (i.e. to transition from on to off). The reset process may be caused by Joule heating resulting from a high current, which disrupts the filament, and so prevents conduction from the first electrode to the second electrode. Such disruption may be localised to a particular position along the filament, for example, at the top of the filament, such as shown in FIG. 1c. For asymmetric devices, such as a metal-insulator-semiconductor device (MIS), the reset process generally requires applying a voltage of opposite polarity to that applied for the set process.

Figure 2:
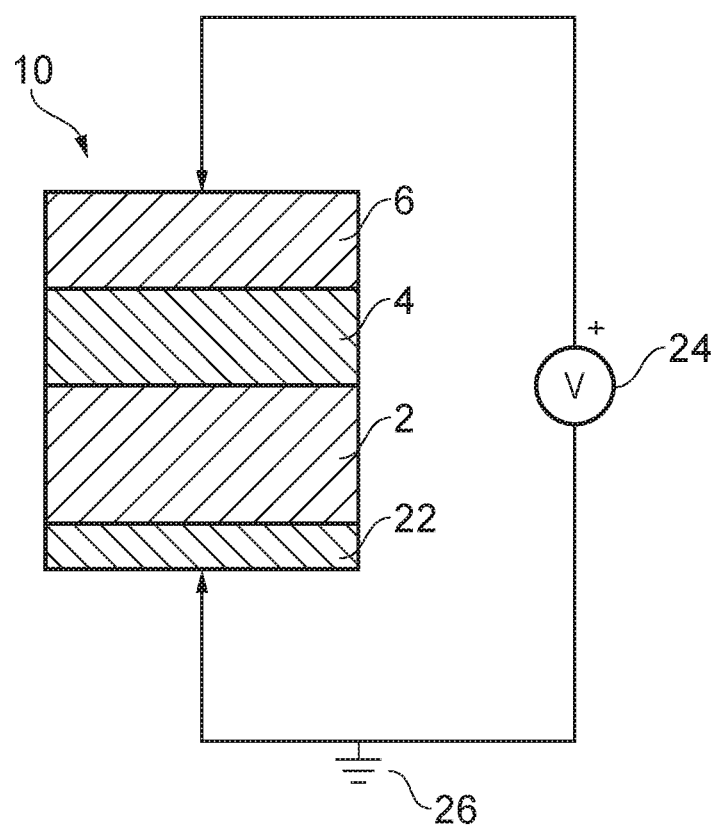
FIG. 2 is a schematic cross-sectional diagram of a switching resistor including external components for providing a voltage bias to the switching resistor.

FIG. 2 shows a cross-section of the switching resistor 10 together with components for applying a voltage (bias) to the switching resistor. In particular, the switching resistor 10 is supported on a substrate 22 (also referred to as a wafer), which is most typically a semiconductor (such as Si) or a dielectric (such as $SiO_2$, sapphire or quartz). The first electrode layer 2, the dielectric layer 4 and the second electrode layer 6 are deposited onto the substrate in the above order. Note that in some cases, the substrate 22 or wafer itself acts as the first electrode (in which case the substrate 22 must be formed of a suitable conductive material, such as a doped semiconductor or metal).

FIG. 2 further includes an electrical source 24, such as a battery or cell, or any other suitable voltage or current source, to apply a bias voltage and/or current to the switching resistor 10 by electrically connecting the positive terminal of the electrical source 24 to the second electrode layer 6 and the negative terminal (i.e. earth 26) to the contact layer 22 (or directly to the first electrode 2). Typically the electrical source can be controlled (varied) to provide a suitable voltage and current to the device 10 to perform the desired setting and resetting operations. Note that bias voltages are defined herein with respect to the polarity of the second (top) electrode 6 compared with the first (lower) electrode 2. Thus the configuration shown in FIG. 2 represents a positive applied voltage (since electrode 6 is positive with respect to electrode 2). However, if the connections of electrical source 24 were applied in the reverse configuration, this would represent a negative applied voltage (i.e. a negative bias). For the configuration of FIG. 2, the polarity of the bias also reflects the polarity of the second electrode 6 relative to ground 26 (for the ground connection shown in FIG. 2).

The dielectric layer 4 may comprise any dielectric material suitable for use in a switching resistor, such as silicon oxide, $SiO_x$, where x does not equal 2 (non-stoichiometric silicon oxide), silicon dioxide ($SiO_2$), silicon nitride, silicon carbide, silicon oxynitride, aluminium dioxide (alumina), germanium oxide, germanium nitride, gallium nitride, zinc oxide, titanium oxide, tantalum oxide, niobium oxide, and high-K dielectrics such as hafnium dioxide, hafnium silicate, zirconium dioxide, and zirconium silicate. The dielectric material may be stoichiometric or non-stoichiometric. The use of silicon-based compounds as the dielectric layer is advantageous because silicon compounds can be integrated more readily into CMOS processing.

The dielectric layer 4 typically has a thickness of from about 3 nm to about 1 μm, more commonly in the range about 3 nm to about 200 nm, more commonly in the range of about 15 nm to about 170 nm, more commonly in the range of about 20 nm to about 50 nm. The dielectric layer 4 may adopt any suitable structure for forming a conductive filament when the memory resistor is in the LRS. Without being bound by a particular theory, it is believed that the dielectric layer 4 of device 10 is inhomogeneous, whereby the dielectric material does not have a uniform structure but has at least two domains. The domains may have different degrees of defects or deficiency centres. The boundaries between domains may act as efficient nucleation centres for the formation of conductive pathways or filaments between the first and the second electrodes.

The dielectric layer 4 may be deposited by any technique that allows a suitable structure to be formed, for example, sputtering, chemical vapour deposition (CVD), molecular beam epitaxy (MBE), metal-organic chemical vapour deposition (MOCVD), atomic layer deposition (ALD) and evaporation techniques. Note that sputtering typically results in columnar growth of the dielectric layer and so layers produced in this way are not homogeneous, i.e. sputtering may help to form the desired inhomogeneities. One potential technique is magnetron sputtering, in which atoms are ejected from a solid target material as a result of bombardment of the target by highly energetic particles. The ejected atoms can then be deposited onto a substrate, enabling the growth of a thin film. Such magnetron sputtering may involve magnetron co-sputtering, in which more than one atom type is used to form a thin film on a substrate. Alternatively, if techniques are used for forming the device 10 that would ordinarily produce highly homogeneous materials, such as CVD, MBE, MOCVD and ALD, steps may be taken to reduce the level of homogeneity.

In fabrication of the switching resistor 10, the first electrode 2 may be formed on a suitable substrate 22 and the second electrode 6 may be formed on the dielectric layer 4 using conventional deposition technology, such as sputter deposition, evaporation, vapour deposition and lithographic processes. The first and second electrodes are typically about 10 nm to about 1 μm thick, for example, about 50 nm to about 500 nm thick.

The first electrode layer 2 is typically composed of a semiconductor material, for example, silicon. The silicon is generally doped, either p-type or n-type, to provide suitable conductivity. The first electrode layer may be made of any material that produces free (mobile) electrons in response to light, such that the free electrons (or other mobile charge carriers) generated in response to light are able to migrate into the dielectric layer 4. Further example materials that may be used in the first electrode layer 2 include germanium and hafnium based semiconductors.

The second electrode layer 6 may be selected from any conventional electrode material(s), such as (doped) silicon (polycrystalline or crystalline), indium tin oxide (ITO), graphene, zinc oxide, tin oxide, and metals such as gold, silver, copper, titanium, molybdenum, aluminium and chromium. In some implementations, the second electrode layer 6 is composed of a metallic material, while in other implementations the second electrode layer 6 is composed of a semiconductor material, for example (doped) silicon. As described in more detail below, in some configurations, the second electrode may be (partly) transparent to support optical irradiation of the first electrode layer.

The first electrode layer 2 and the second electrode layer 6 may be both formed of silicon, whereby, for a symmetric configuration, the first and second electrode layers 2, 6 would both have p-type doping or would both have n-type doping. Alternatively, in an asymmetric configuration, the first electrode 2 may be p-doped and the second electrode 6 may be n-doped, or the first electrode 2 may be n-doped and the second electrode 6 may be p-doped. More generally, the use of asymmetric electrodes, i.e. the first electrode having different doping and/or materials (and/or structure) from the second electrode, may offer added functionality over symmetric devices by allowing clear differentiation between the two operating polarities.

Figure 3:
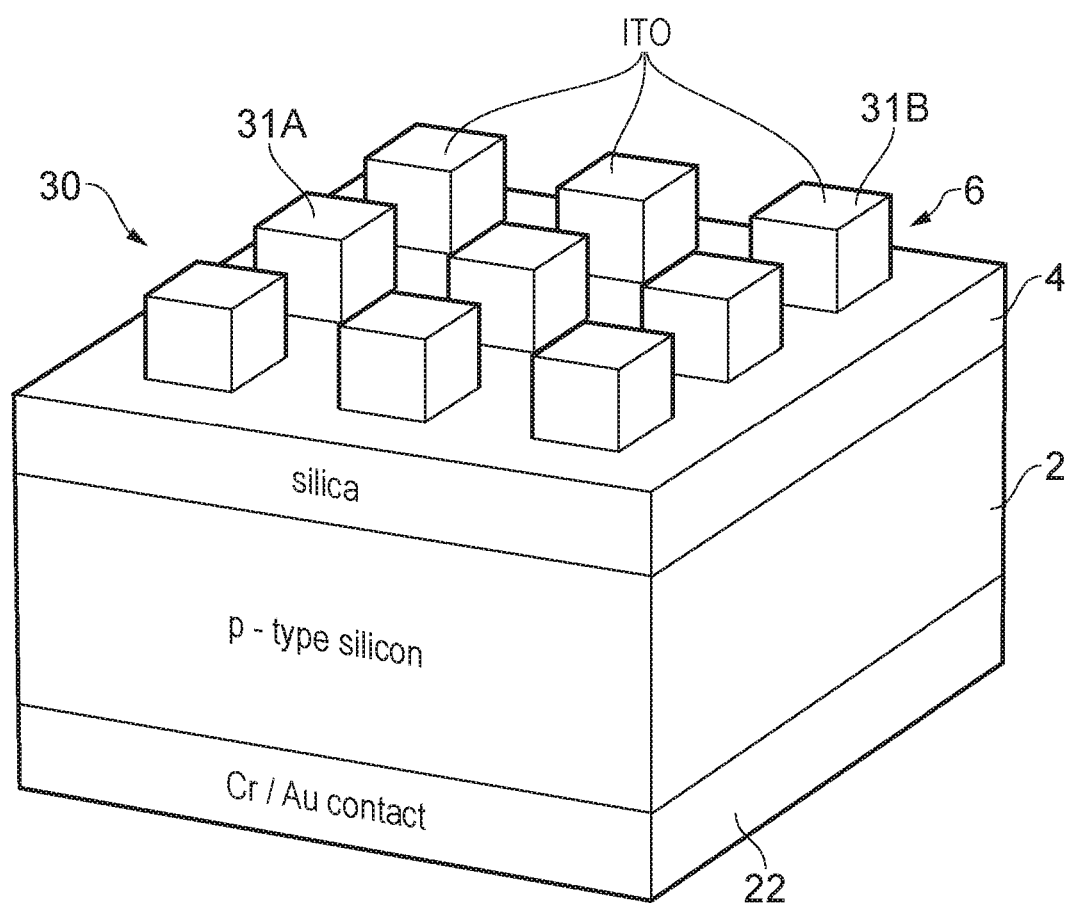
FIG. 3 is a schematic diagram of an array of switching resistors (RRAM cells) as used for various experiments described in the present application.

FIG. 3 illustrates an example array 30 of RRAM cells having a metal-insulator-semiconductor structure to achieve resistance switching. The array was fabricated by depositing a dielectric layer 4, comprising 35 nm of silica (silicon dioxide), onto the first electrode, a p-type silicon substrate 2, by magnetron co-sputtering at 500° C. The silica was measured using X-ray photoelectron spectroscopy to have an excess silicon content of 11%. After deposition of the dielectric layer 4, the device 30 was annealed at 500° C. under nitrogen for one hour to encourage the limited formation of silicon nanoclusters in the silica layer 4. Once the device had cooled, the second electrode 6, comprising 70 nm of indium tin oxide (ITO), was then deposited by sputtering as a layer on top of the silica 4 dielectric. Note that this ITO layer 6 is transparent, thereby enabling certain optical effects to occur, as described in more detail below.

To create the array of cells, 500 μm×500 μm square contacts were cut by photolithography in the second (ITO) electrode layer 6, followed by a 30 second bath in hydrochloric acid. Each square contact 31A, 31B defines a single switching resistor 10 (RRAM cell) of the switching resistor array 30—i.e. RRAM voltage characteristics can be achieved by using any square contact 31A, 31B of the array 30. A chrome-gold Ohmic contact 22 was then applied to the base of the p-type silicon semiconductor electrode 2 by an evaporation process. The contact 22 comprised 10 nm of chrome and 100 nm of gold. Each separate cell (switching resistor) of the array 30 therefore has a respective connection to a respective voltage source for applying a voltage bias across the electrodes of that particular cell.

It will be appreciated that the device of FIG. 3 is shown by way of example, and in other implementations, different materials and different configurations may be used, e.g. the shape, size and/or material(s) of the first and/or second electrode layers 2,6 may be modified. For example, in some implementations, the size of the contacts for an individual cell might be in the range 50 nm×50 nm, to about 1 mm×1 mm. In addition, in some implementations, the contacts may have a different shape, e.g. rectangular or round, rather than square.

Figure 3A:
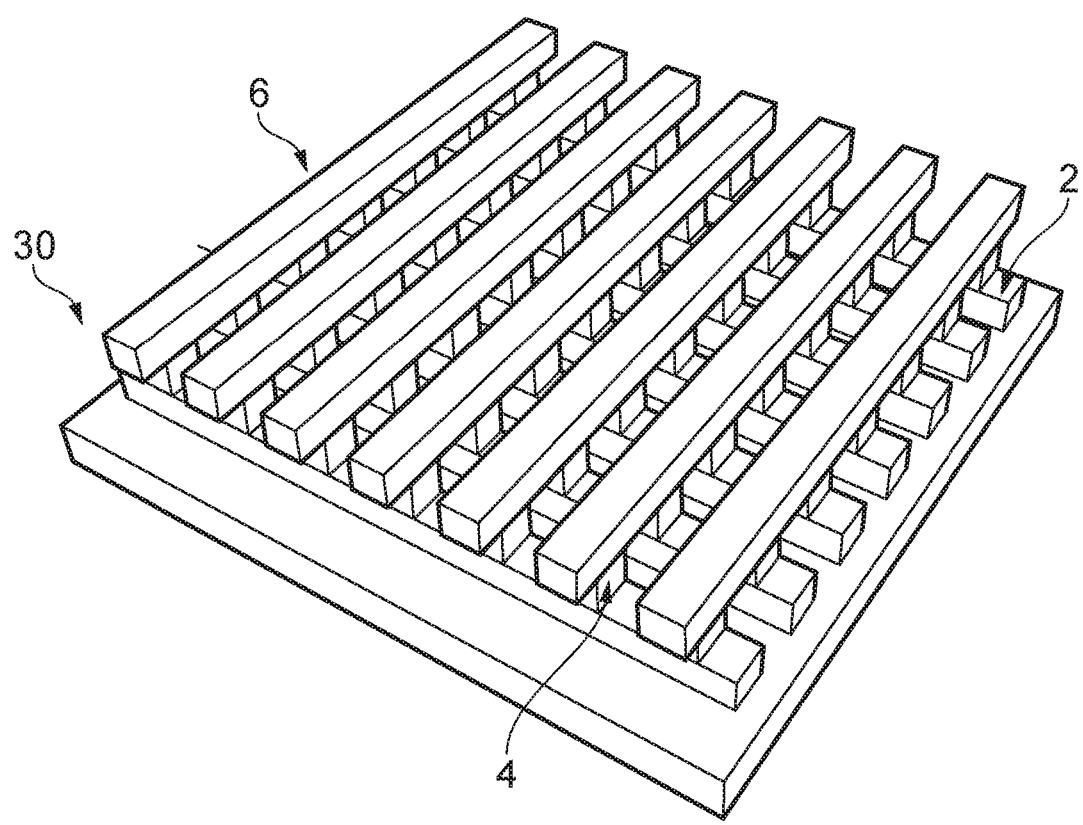
FIG. 3A is a schematic diagram of an array of switching resistors (RRAM cells) electronically connected using a cross-bar array of top and bottom electrodes.

FIG. 3A shows another example of an array 30 of RRAM cells to provide resistance switching. The device of FIG. 3A comprises a cross-bar array to facilitate the selection of a particular cell of the array 30. A first set of contacts, providing the first electrode 2 for each cell of the array, is formed as a series of parallel strips (bars) on or as the base of the device, and a second set of contacts, providing the second electrode 6 for each cell of the array 30, is formed as a series of parallel strips (bars) on the upper side of the device. The bars of the first set of contacts are perpendicular to the bars of the second set of contacts (hence the term cross-bar). Sandwiched between the first set of contacts and the second set of contacts, and located at each intersection between a strip forming the first electrode 2 and a strip forming the second electrode, is a respective dielectric layer 4. The selection of (i) a particular one of the first set of contacts and (ii) a particular one of the second set of contacts allows a voltage to be applied across any given cell of the array.

Current-voltage measurements were performed on the array 30 of RRAM cells shown in FIG. 3 using a Keithley 4200 Semiconductor Characterisation System (from Tektronix) (www.tek.com/keithley) in conjunction with a Signatone probe station (www.signatone.com). The measurement system was used in two-terminal mode, with one probe pressed against the top of an ITO contact, and the lower probe grounded against the Signatone base plate, on which the Cr/Au contact was seated. All testing was performed at room temperature with the Signatone probe station contained within a dark box.

A RRAM cell of the array 30 was exposed to light by directing the light down an optical fibre, through an optical microscope inside the dark box, and onto the sample. Five different laser sources were used for the measurements, as well as white light from a filament bulb. When directed through the optical fibre and onto an RRAM cell, the light (visible or infrared) experiences attenuation and spread (dispersion). This was accounted for by measuring the laser light both before entering the optical fibre and also as incident on a RRAM cell. Table 1 gives further details about the five light sources used, including the wavelength, laser output power, and laser power incident on the RRAM cell. Note that these details are provided for illustrative purposes only, and other implementations may use different wavelengths, output powers, and/or incident powers.

TABLE 1 light sources used to test the optical response of RRAM cells

| Wavelength (nm) | Laser output power (mW) | Laser incident power (μW) |
| --- | --- | --- |
| 632.8 ± 0.1 | 0.65 ± 0.03 | 0.04 ± 0.01 |
| 650 ± 10 | 2.2 ± 0.1 | 0.14 ± 0.03 |
| 532 ± 10 | 9.2 ± 0.7 | 0.6 ± 0.1 |
| 410 ± 10 | 12 ± 2 | 0.8 ± 0.3 |
| 1152 ± 1 | 0.48 ± 0.05 | 0.03 ± 0.01 |

Figure 4:
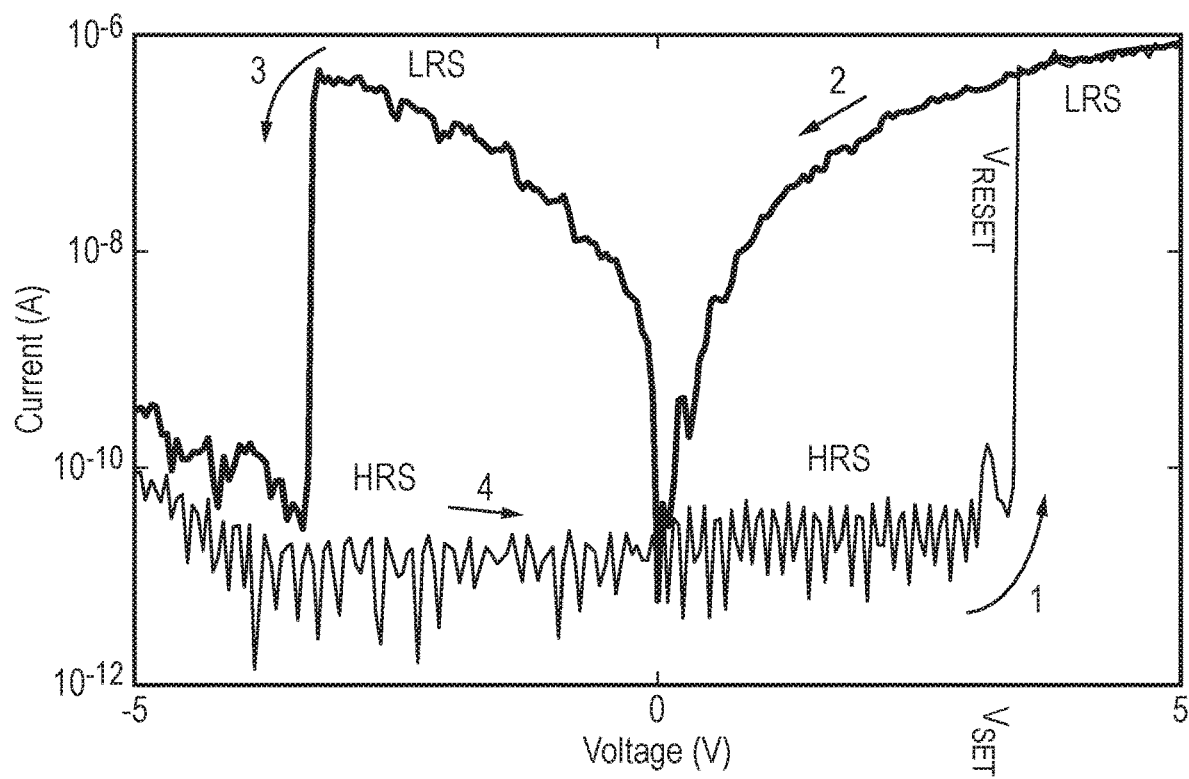
FIG. 4 shows a plot of current against voltage, in darkness, of an RRAM cell such as shown in FIG. 3, with various states and state transitions indicated.

FIG. 4 shows a typical current-voltage (IV) response, in darkness, of a RRAM cell such as shown in FIGS. 1-3A. (Note that FIG. 4 shows current on a logarithmic scale according to absolute current flow, i.e. irrespective of the direction of current flow; in practice, the negative voltage region produces a negative current, i.e. a current in the opposite direction to the current produced in the positive voltage region). As described in [9, 10, 18], by raising the voltage above a threshold voltage $V_{SET}$, the cell transitions from the HRS to the LRS through the set process. This is denoted in FIG. 4 by the arrow 1, with $V_{SET}$+3.5 V. When the voltage is reduced, as indicated by arrow 2, the cell remains in the LRS, until a negative threshold $V_{RESET}$ is achieved, as indicated by arrow 3. The cell now transitions from the LRS to the HRS via the reset process. A further set/reset cycle can now be initiated by increasing the voltage again, as denoted by arrow 4 in FIG. 4.

Figure 4A:
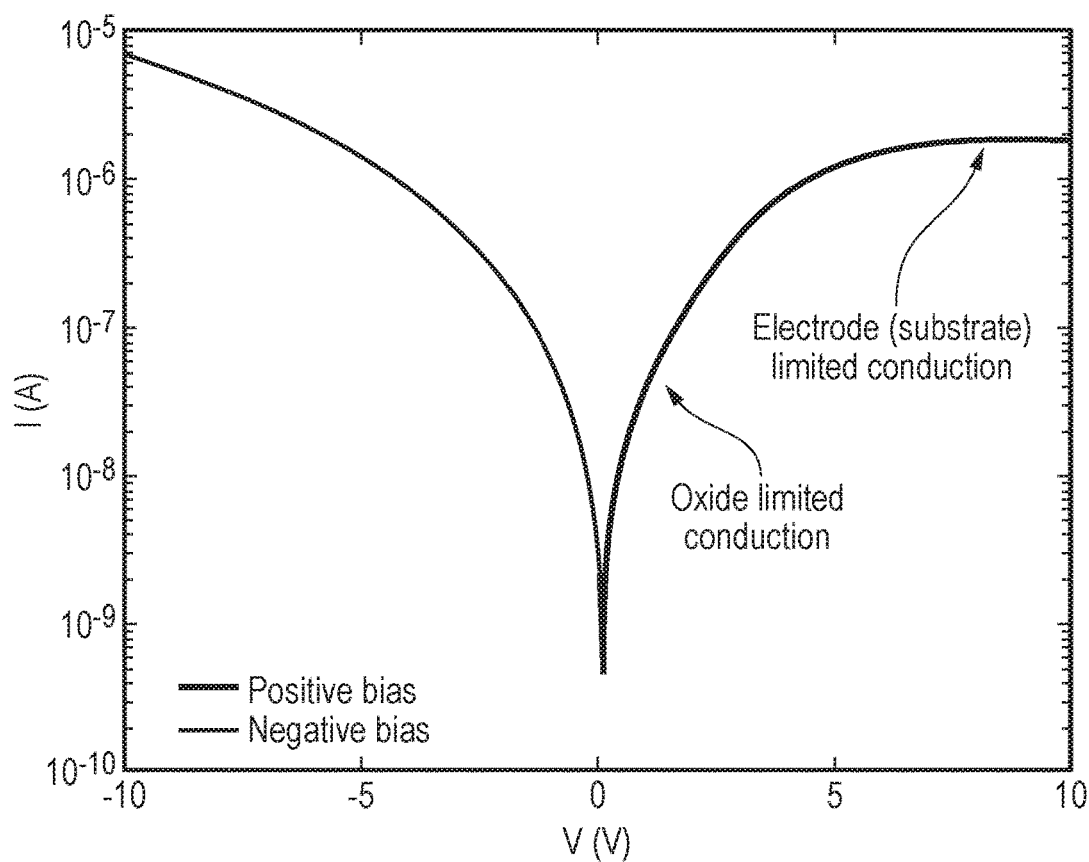
FIG. 4A is a schematic plot showing an example of current against voltage for an asymmetric RRAM cell such as shown in FIG. 3 operating in the LRS (and in darkness).

FIG. 4A shows another typical current-voltage (IV) response, in darkness, of a RRAM cell such as shown in FIGS. 1-3A (again with the current shown on a logarithmic scale). In particular, FIG. 4A shows the device operating in the LRS.) Note that this device of FIG. 4A has a higher value of $V_{SET}$ compared with the device of FIG. 4, and likewise a higher, i.e. more negative, value of $V_{RESET}$ compared with the device of FIG. 4). The device of FIG. 4A is asymmetric, which can be seen, inter alia, from the different response curves for positive and negative bias (applied voltage)—e.g. the maximum current for negative bias is larger than the maximum current for positive bias.

FIGS. 5a to 5d (collectively FIG. 5) show the effect, at increasing voltage bias (1V, 4V, 5V and 7V for 5a to 5d respectively) of optical stimulation on an $SiO_x$ switching resistor as described herein. In these measurements, the switching resistor (RRAM cell) was placed in the HRS before being biased at a selected voltage (as indicated in the top left corner of each plot). For each bias voltage, the current was sampled every 0.3 seconds for a total of 15 seconds, with the cell being exposed to white light for the central 5 seconds. (The sample current values are marked in FIG. 5 with dark grey crosses for the period of no illumination, and light grey crosses for the central period of illumination).

As can be seen from FIG. 5a, in the HRS and with low voltage bias (1V), there is little or no response to the illumination during the central 5 seconds. When the voltage bias is raised to 4V, as seen in FIG. 5b, a current spike is seen at the onset of the period of illumination, and then again at the onset of the following period of darkness. Note that these two current spike have opposite polarity, as can be seen from the inset (linear scaling) shown in FIG. 5b—in which the first current spike (for illumination) has positive polarity, while the second current spike (for darkness) has negative polarity. For both current spikes, the spike decays over a period of a few seconds. This is a typical response for the charging and discharging of a capacitor.

At the higher bias voltage of 5V in FIG. 5c, the cell transitions from the HRS to the LRS in response to the illumination, as indicated by the sudden (step) increase in current level when the illumination starts. When the illumination is turned off, the current remains at the higher level, indicating a change of the resistance state and that the device now remains in the LRS. This transition from the HRS to the LRS of FIG. 5c corresponds to the SET process shown in FIG. 4. FIG. 5c therefore shows light-activated or triggered switching from the HRS to the LRS.

FIG. 5d shows a slightly different situation, in that the cell commences in the LRS (as indicated by higher starting level of current). In this case, the introduction of illumination leads to a higher current flow (indicating reduced resistance). This high current decays relatively quickly, back to the initial current level, once the illumination has terminated, thereby indicating a transient behaviour and no change of the resistance state.

Figure 5:
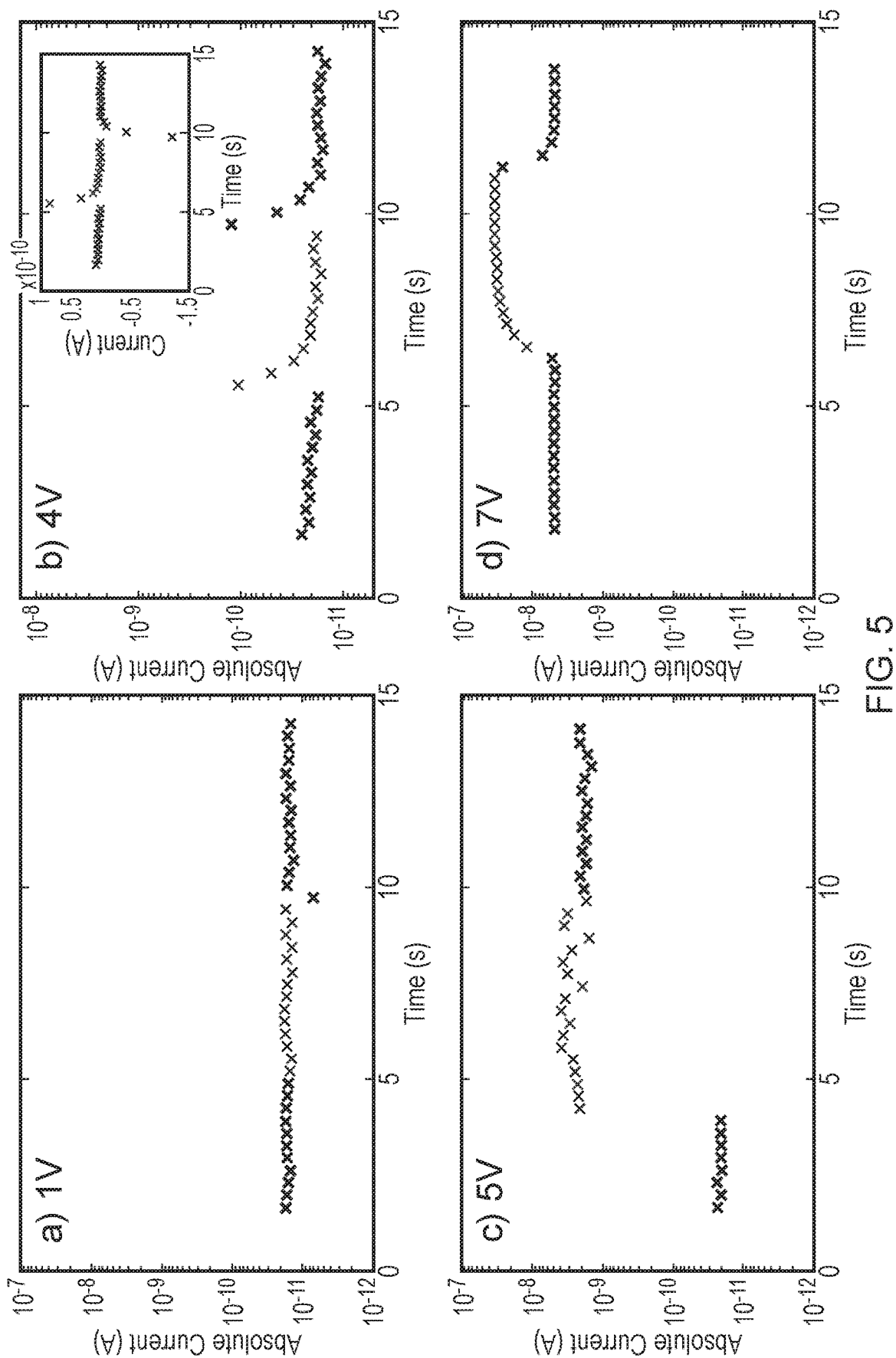
FIGS. 5a to 5d (collectively FIG. 5) show the current as a function of time for an RRAM cell, such as shown in FIG. 3, each Figure corresponding to a respective bias voltage (as indicated in the top left corner of each plot, and increasing from FIG. 5a to FIG. 5d). The RRAM cell is subject to optical illumination with white light during a time period from 5 s until 10 s. Note that in FIGS. 5a-5c, the device is initially in the HRS, while for FIG. 5d, the device is initially in the LRS.

FIG. 5 therefore demonstrates four different patterns of response that are observed in the RRAM cell in response to illumination. In the HRS and at low voltage bias, as per FIG. 5a, the cell has little response to light. When the bias voltage is raised, current spikes and corresponding decays are observed, as seen in FIG. 5b. At higher voltages, such as 5V in FIG. 5c, the cell experiences a sudden increase in current when the light is applied, which is not mirrored (reversed) when the light is removed. This is the same type of current increase observed at $V_{SET}$ in FIG. 4, and corresponds to the set process for the switching resistor. In other words, FIG. 5c is an example of light-activated switching occurring in a RRAM device. Finally, FIG. 5d shows the RRAM cell response in the LRS, where the current rises and falls at the start/end of illumination respectively (but without changing the state of the device).

To investigate further the light-activated switching seen in FIG. 5c, time-bias measurements were performed on a RRAM cell in the HRS state biased at around 5V. Light-activated switching was successfully observed using the 650 nm, 632.8 nm, 532 nm and 410 nm (all optical) lasers. No switching of the RRAM cell was observed using the 1152 nm (infrared) laser. The current was sampled every 0.15 s (this measurement timescale is just a limitation of the measurement equipment, and is not in any way related to a property of the example device itself—typically the actual switching timescale is of the order of nanoseconds).

The results of these measurements are shown in FIGS. 6a to 6d (collectively FIG. 6), which correspond to using the 650 nm, 632.8 nm, 532 nm and 410 nm lasers respectively. Note that the switching of FIG. 6d, for the 410 nm laser, was delayed with respect to the start of the illumination by several seconds, whereas for the other lasers shown in FIG. 6, the switching occurred directly at the onset of illumination. (As noted above, no switching occurred for the 1152 nm (infrared) laser, which is not represented in FIG. 6). In addition, for each laser, there is a current decrease seen at around a time of 13 seconds—this corresponds to a drop in induced (photo) current while the switching resistor is in the LRS state.

Figure 6:
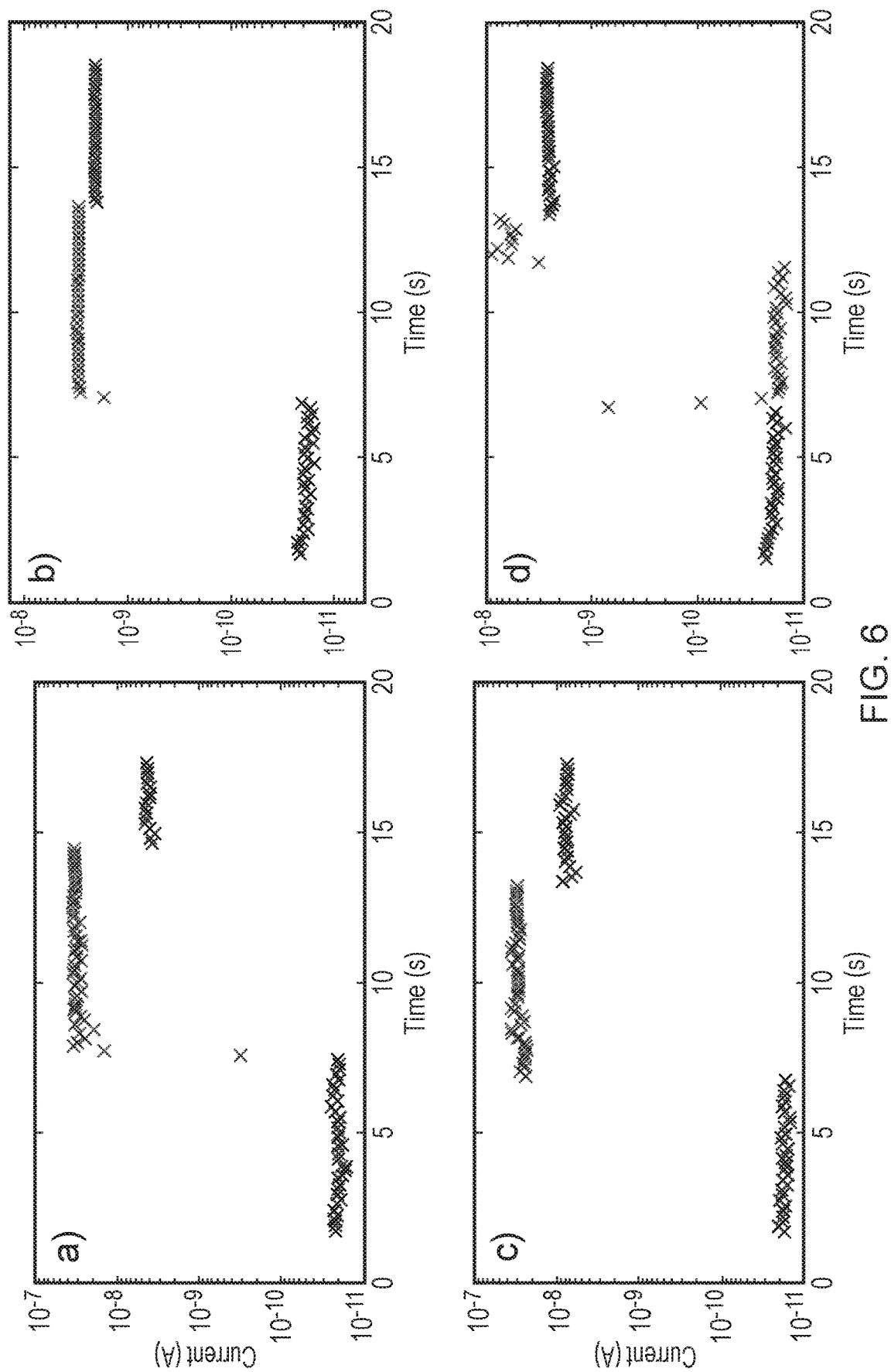
FIGS. 6a to 6d show the current as a function of time for an RRAM cell, such as shown in FIG. 3, for four respective wavelengths of illuminating light (the light wavelength decreasing from FIG. 6a to FIG. 6d). In all cases, the RRAM cell is initially in the LRS, and is subject to optical illumination during the time period from 5 s until 10 s.

The light energies applied to achieve the switching shown in FIG. 6 are (21±4) µJ, (12±2) µJ, (90±20) µJ, and (3±1) mJ for parts 6a through 6d respectively. Note that the applied energy for FIG. 6c at 532 nm is a maximum value, since the switching timescale is shorter than the measurement timescale (of 0.15 s).

To investigate variations in $V_{SET}$ (the set voltage, see FIG. 4) for a given device, and the potential impact on (and of) optical switching, 131 switches in darkness were carried out and $V_{SET}$ measured each time. From this data, $V_{SET}$ was measured as (4.98±0.59) V for the device, with a standard error on the mean of ±0.05 V. Similarly, 62 switches were carried out under illumination from the 632.8 nm laser. From this data, $V_{SET}$ was measured to be (4.70±0.50) V, with a standard error on the mean of ±0.06 V. This from these observations, it is apparent that $V_{SET}$ is found to decrease with the application of incident laser light.

To further investigate this effect, the 632.8 nm laser was directed through a series of neutral density filters to vary the amount of power incident on the RRAM cell. At each intensity level, between 20 and 30 SET and RESET operations (cycles) were performed, in order to determine a distribution of $V_{SET}$ for each intensity level.

Figure 7:
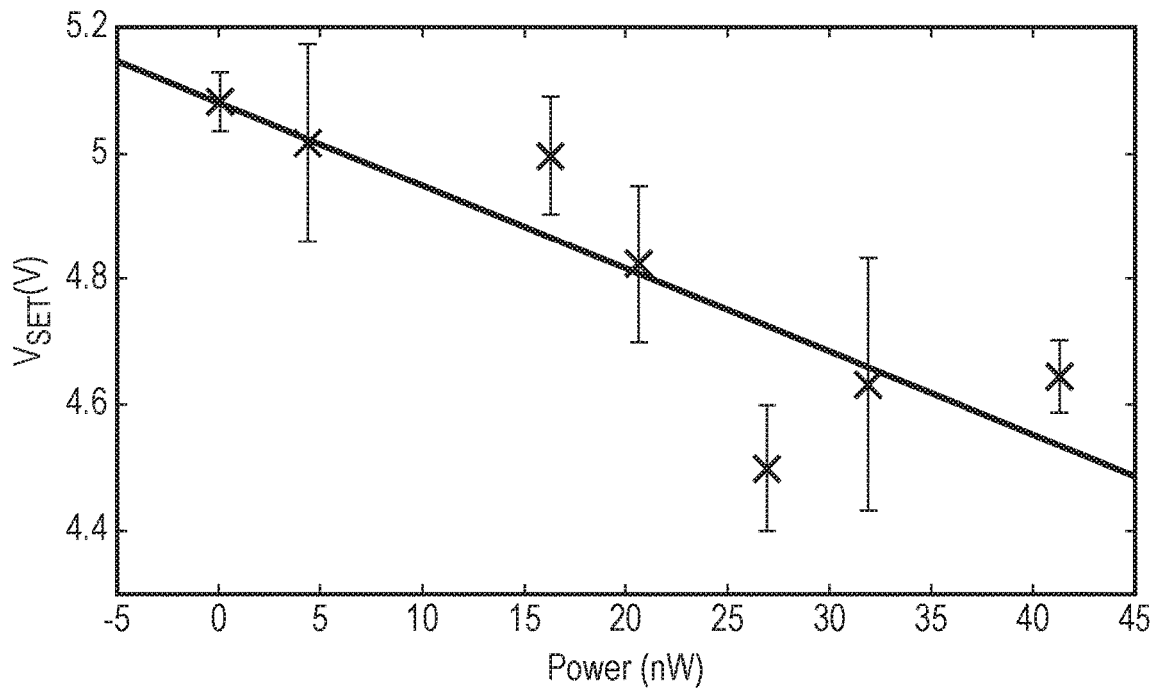
FIG. 7 is a plot of $V_{SET}$ (the set bias voltage) against optical laser power incident on a RRAM cell such as shown in FIG. 3 (these measurements were obtained using laser light having a wavelength of 632.8 nm).

FIG. 7 is a plot of the resulting range of variation of $V_{SET}$ against incident laser power. (This analysis was only performed using the 632.8 nm source). An incident power of 0 (zero) corresponds to darkness, while 41 nW was the maximum incident power. The variation in $V_{SET}$ at each power level is indicated by a vertical error bar representing the standard error on the mean (the crosses plot the mean values). Note that FIG. 7 confirms the finding presented above that the application of light or illumination reduces $V_{SET}$ (in an approximately linear manner according to the plot of FIG. 7, which indicates a negative correlation between incident laser power and $V_{SET}$).

Figure 8:
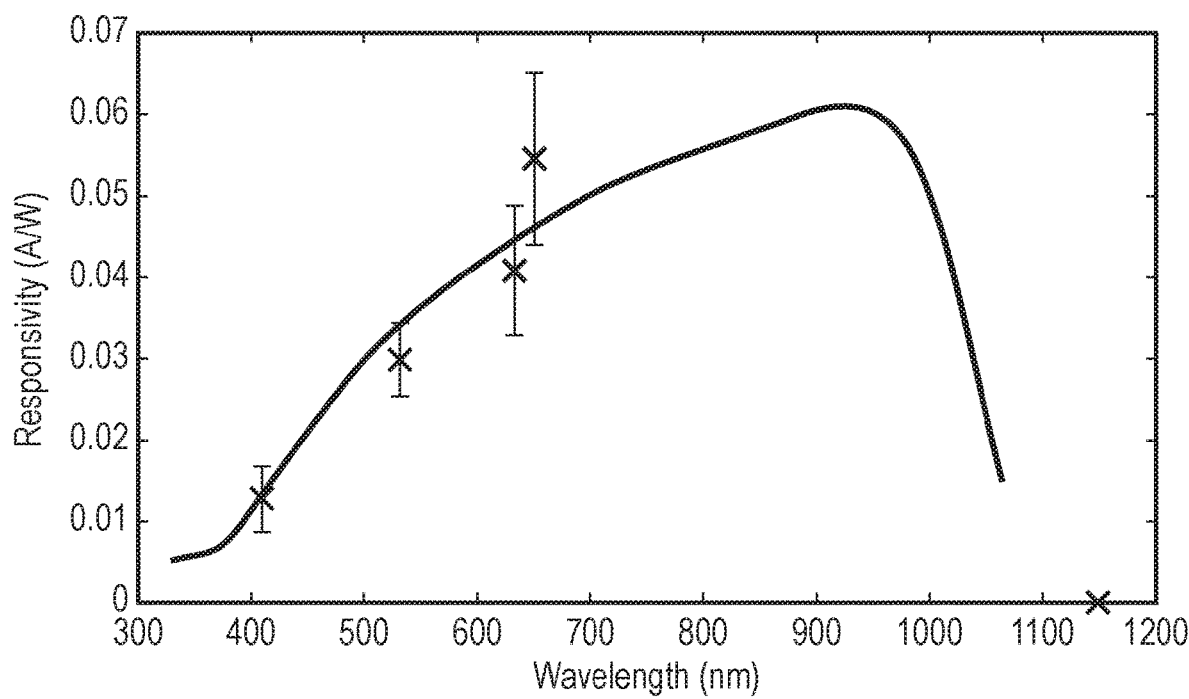
FIG. 8 is a plot of the responsivity (current divided by incident laser power) at the four wavelengths of laser illumination used for investigating a RRAM cell such as shown in FIG. 3. A typical responsivity curve for silicon is also shown as a solid line (reduced by a factor of 10).

Returning to FIG. 6, it can be seen that the level of the induced current in the LRS varies with the applied wavelength of laser illumination. FIG. 8 is a graph showing how the photocurrent induced in the RRAM cell while in the LRS varies with wavelength. More particularly, the induced photocurrent is shown in the form of responsivity, which is the induced current normalised by the incident laser power.

FIG. 8 further shows a typical silicon responsivity curve overlaid for comparison (this curve is reduced by a factor of 10, which can be considered as an empirically appropriate scaling factor). The apparent similarities between the switching resistor responsivity characteristics (data points) and the typical silicon photodetector (solid line) suggest that the silicon in substrate 2 (see FIG. 3) is absorbing the light, which could then generate free carriers within the device. FIG. 8 further suggests why the optical switching is less effective for light at 410 mm, and not effective at all for infrared illumination at 1152 nm, in that the dielectric silica layer is substantially transparent to light of these wavelengths. For example, for a silicon bandgap of 1.14 eV, the maximum absorption wavelength corresponds to an incident photon of 1088 nm, consistent with the responsivity data shown in FIG. 8, and also with the lack of light-induced switching for the infrared laser (because the infrared photons have insufficient energy to promote an electron across the band-gap). Overall, there is generally a good match between the silicon responsivity curve and the photocurrent response of the RRAM cell as a function of wavelength.

Figure 9:
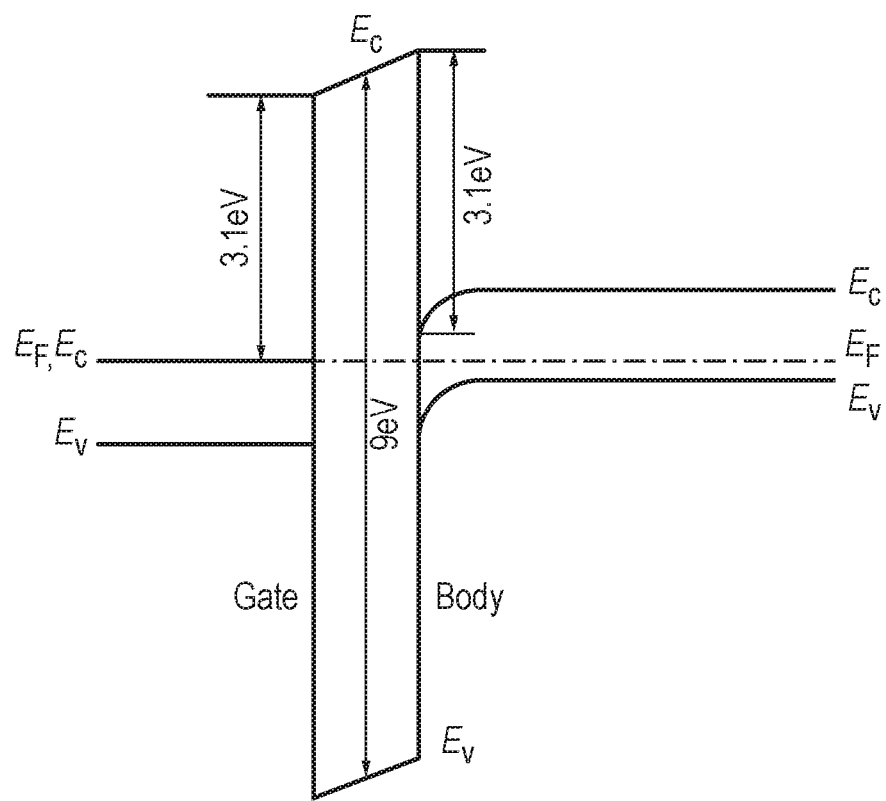
FIG. 9 is a schematic diagram showing the band structure, without applied bias, of a RRAM cell such as shown in FIG. 3. The horizontal (x) direction represents distance (depth) into the RRAM cell (as measured in a direction perpendicular to the layers), while the vertical (y) direction represents energy level (voltage).

FIG. 9 shows a band diagram (structure) representing the energy levels of an unbiased RRAM cell (switching resistor) having a first, lower, electrode 2 of p-type silicon, denoted as the "body" in FIG. 9, and connected to ground. A dielectric layer 4 of silicon dioxide ($SiO_2$), and a second (upper) electrode of $N^+$ polysilicon (denoted as the gate in FIG. 9) are located on top of the first electrode 2. In addition, it is assumed that the device shown in FIG. 9 is in the HRS. The energy levels of the conduction and valence bands are indicated respectively as $E_c$ and $E_v$, while $E_F$ denotes the Fermi energy level. It can be seen that there is a significant band-gap between the conduction and valence bands for the silicon dioxide dielectric.

The structure shown in FIG. 9 can be used to help explain the results shown in FIG. 5b, in which the current-time response of the switching resistor is similar to a charging and discharging capacitor (formed by the gate, body and intervening dielectric). In particular, we can model the apparent charging and discharging of the MIS capacitor with current flowing through the external circuit when exposed to light, as illustrated in FIG. 5b, by assuming that the silicon substrate 2 (see FIG. 3) is the optically active part of the device. This assumption is supported by the high transparency of ITO in visible wavelengths [26], as well as the similarity discussed above in FIG. 8 between (i) the RRAM responsivity values, and (ii) the silicon responsivity curve. In our model, we consider an incidence rate of Φ photons per second onto the sample when the switching resistor is illuminated. This is determined by the power of the light incident on the switching resistor, $P_{SR}$, divided by the energy of each photon, such that:

$$\Phi = \frac{P_{SR}\lambda}{hc},$$

where λ is the photon wavelength. In the implementation of FIG. 3, in order to be successfully absorbed by the silicon substrate 2, a photon of light must first be transmitted through the top ITO contact 6 and the middle silicon oxide layer 4. The photon must then be finally absorbed by the silicon substrate 2 with a success probability governed by the quantum efficiency of this process. We combine all these factors into a material attenuation constant, β, so that the photon flux actually absorbed by the silicon substrate is given by βΦ.

In this model, each such photon absorption promotes a charge carrier in the silicon, which remains in this state for the duration of the carrier lifetime τ. Therefore, the number of extra photo-generated charge carriers due to the incident light at any given time is given by:

$$N = \beta \frac{P_{SR}\lambda}{hc}\tau,$$

This can be expressed in terms of the illumination source power, P, by substituting $P_{SR}=\alpha P$, such that:

$$N = \frac{\alpha\beta P\lambda\tau}{hc}, \quad (1)$$

where α is the attenuation of the light occurring between the illumination source and the switching resistor. The introduction of N new carriers near the semiconductor surface enables carrier injection into the oxide layer under appropriate bias conditions.

Figure 10:
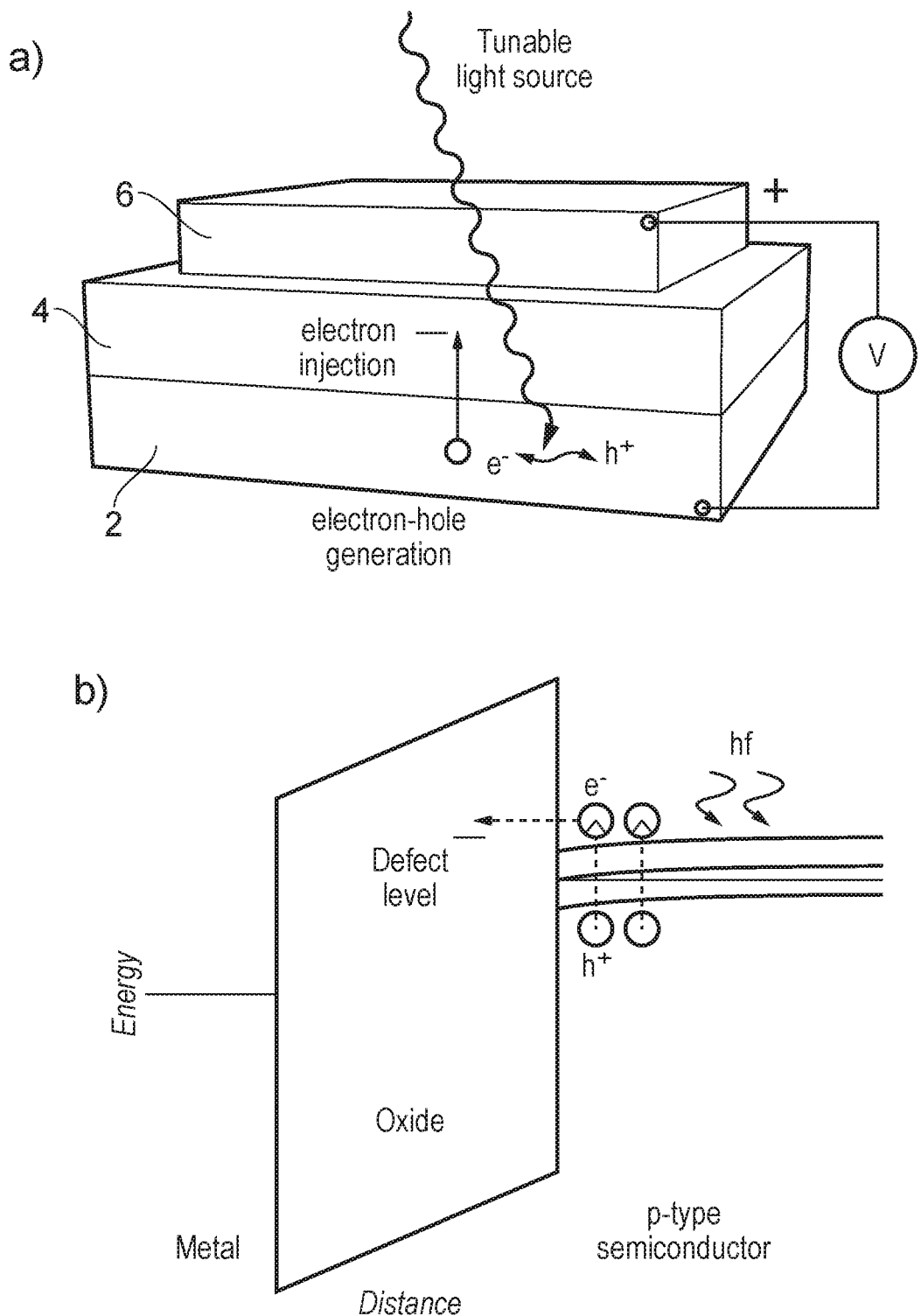
FIG. 10a is a schematic diagram of a switching resistor (RRAM cell) under photo-illumination as described in the present application.
FIG. 10b is a schematic band energy diagram showing the band structure of a RRAM cell, such as shown in FIG. 10a. In comparison with the band energy diagram of FIG. 9, it can be seen that the photo-illumination results in the production of free electrons which may be injected into defect energy levels of the silicon oxide.

FIG. 10a is a schematic diagram showing the generation of charge carriers as a result of optical illumination for a switching resistor similar to that of FIG. 3 and comprising a transparent (top) second electrode 6 (ITO), a thin dielectric layer 4 (silicon oxide, 35 nm) and a first (bottom) electrode 2 made of a p-type substrate. The switching resistor of FIG. 10a is biased positively (according to the convention discussed above in relation to FIG. 2, namely with a positive voltage applied to the top ITO contact). The switching resistor may be irradiated by, for example, a tuneable white light source or laser. As a result of the irradiation or illumination, electron-hole pairs may be generated by the interaction of photons with the p-type semiconductor. The electrons may then travel into the silicon oxide layer in response to the applied voltage.

FIG. 10b represents an energy band diagram corresponding to the structure of FIG. 10a, with the switching resistor biased by the applied voltage. The applied photons from the light source of FIG. 10a are assumed to have enough energy (=hf, where h is the Planck constant, and f is frequency) to form electrons in the conduction band of the silicon substrate. Accordingly, the density of electrons in the conduction band of the p-type silicon is increased by the light-induced generation of electron-hole pairs. These electrons are then injected into the oxide layer 4 by the applied voltage.

By varying the intensity and the duration of the light illumination, it is possible to change the density of electrons available for the injection into the oxide, while keeping the constant electric field across the device. Such an increase of electron injection may result in an increased rate of creation of Frenkel pairs, each Frenkel pair representing an oxygen vacancy and oxygen interstitial ion. (It will be appreciated that as seen in FIG. 10A, the photon absorption creates electron-hole pairs. However, the impact of the hole creation is considered to be relatively minor, since the p-type electrode 2 already contains many holes. Accordingly, the optical illumination causes a much high proportional (relative) increase in electrodes than holes within the first electrode 2).

It is believed that such Frenkel pairs promote the growth of conductive filaments through the dielectric layer as part of the set or forming process to transition to the LRS. In effect therefore, the optical illumination creating the additional Frenkel pairs acts to reduce the set/forming voltage. Consequently, a given applied voltage may be below the set/forming threshold in the absence of optical illumination, but above the set/forming threshold in the presence of suitable optical illumination. Thus as shown in the example of FIG. 5c, if this given applied voltage is initially applied without optical illumination, there is no transition to the LRS, however, when optical illumination is provided, the creation of the Frenkel pairs lowers the set/forming voltage below the given applied voltage, and the transition to the LRS now occurs. Accordingly, the set/forming process is initiated (activated or triggered) by the provision of the optical illumination.

Figure 11:
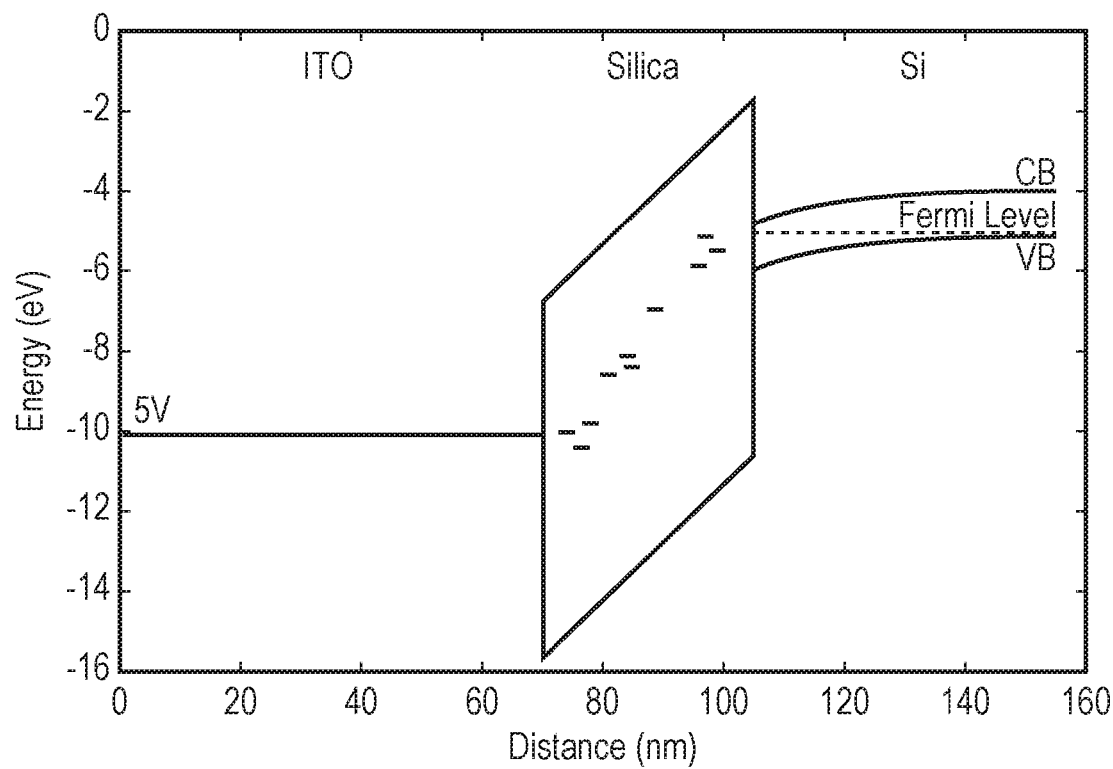
FIG. 11 is another schematic diagram showing the band structure of a RRAM cell such as shown in FIG. 3. In comparison with FIG. 9, there is an applied bias of 5 volts, and the RRAM cell is approaching the set transition to the LRS.
Figure 12:
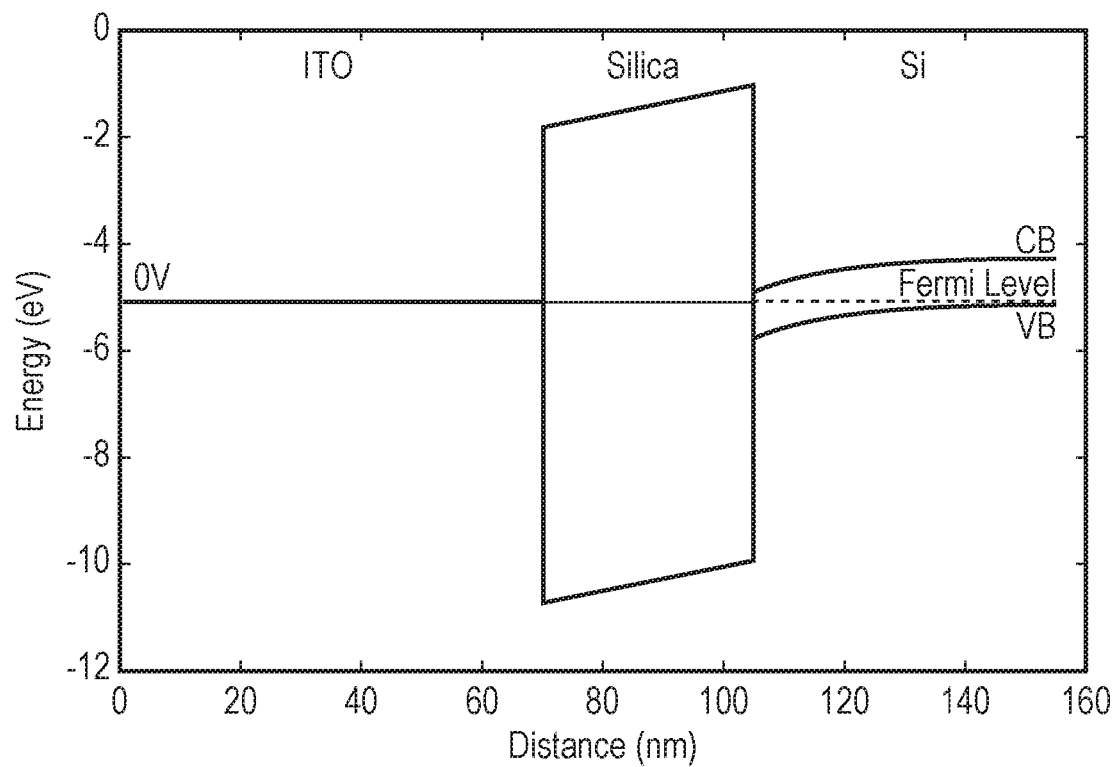
FIG. 12 is another schematic diagram of the band structure of a RRAM cell such as shown in FIG. 3. In comparison with FIGS. 9 and 11, the RRAM cell of FIG. 12 is in the LRS.

FIGS. 11 and 12 provide band diagrams corresponding to this transition of the RRAM cell into the LRS as the bias voltage on the cell approaches (and reaches) $V_{SET}$. In particular, FIGS. 11 and 12 show a spatial coordinate (distance) along a line perpendicular to the various layers of the device. This line is shown to pass through the ITO electrode 6, the silica dielectric layer 4, and the silicon substrate 2. The silicon layer is schematically shows as having a valence band (VB) and a conduction band (CB) with the Fermi level located approximately between the two.

As illustrated in FIG. 11, the bias voltage produces a 5 V drop across the silica layer, which in turn produces band bending at the silica-silicon interface. Visually, once sufficient bending has occurred, the silicon energy levels at the silicon-silica interface more closely resemble an n-type semiconductor rather than a p-type (this has been described as the inverted state of the semiconductor). At this state, any extra applied voltage no longer widens the depletion region but instead produces an exponential increase in electrons at the boundary [27].

Without being bound by theory, the above state is believed to produce an influx of electrons across the boundary from the silicon into the silica, which then become trapped in defects within the silica. In effect, the applied voltage therefore promotes the formation of oxygen vacancies in the silica (dielectric layer 4), whereby these conductive oxygen vacancies align to form a conductive filament [9, 18]. The dielectric layer 4 is considered to create allowed energy states within the normally disallowed bandgap, as shown by the discontinuous bars (red lines) within the silica dielectric layer of FIG. 11.

Once enough oxygen vacancies have formed they introduce sufficient energy levels within the band-gap of the oxide to allow charge to flow, as shown schematically by the red line in FIG. 12. The formation of this conductive path corresponds to the physical formation of the (at least one) conductive filament across the dielectric layer when the switching resistor transitions into the LRS. In particular, FIG. 12 shows the RRAM cell in the LRS with zero applied bias voltage. Sufficient oxygen vacancies have formed across the silica to create the conductive pathway (shown in red) across the silica dielectric. The formation of this conductive pathway allows the RRAM cell to transition from an MIS capacitor (the HRS) to an MIS conductor (the LRS).

In addition, the conductive bridge or pathway across the silica typically forces the first and second electrodes to reach thermal equilibrium, exaggerating the band bending at the dielectric-semiconductor boundary. In this state, the switching resistor's band diagram in effect mimics a metal-semiconductor system, as the insulating behaviour of the dielectric layer 4 has broken down.

The experimental results presented above demonstrate that RRAM cells can provide light-activated switching and that this effect is wavelength-dependent. The relatively low success rate for the shorter wavelength illumination (410 nm) is likely due to the lower responsivity of silicon to blue light, see FIG. 8. Using a higher incident optical power is expected to confirm the relation between switching voltage ($V_{SET}$) and laser power, as shown in FIG. 7. In addition, experiments can be performed at additional wavelength ranges, to supplement the results from the four visible lasers and one IR laser as described above. Such experiments are again expected to provide further confirmation of the finding from FIG. 8 that the p-type silicon represents the optically active portion of the RRAM device.

The model developed above, in which the RRAM system is considered to be a MIS capacitor, provides a useful description of the RRAM system, especially in the HRS. In the LRS, a better model for the RRAM cell may be that it acts as a non-ideal resistor connected in series with a photo-sensitive current source (the first electrode—the p-type silicon semiconductor in the implementation described above). This would suggest that charge mobility in the silicon is the greatest current limitation for the LRS state switching resistor, and is also consistent with the finding described above that the silicon forms the active layer.

Figure 13:
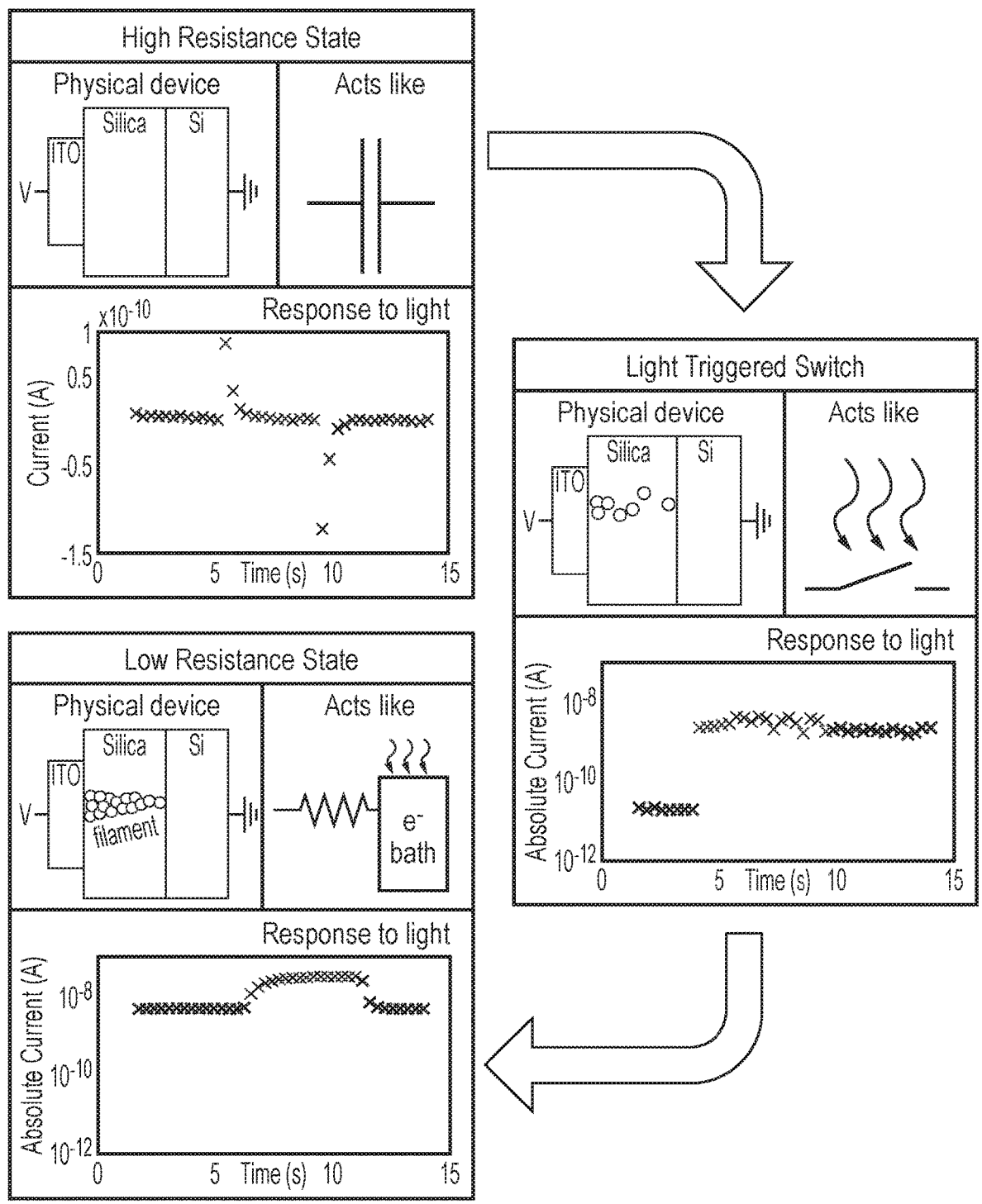
FIG. 13 is a schematic diagram showing an overview of the reaction to light of a RRAM cell such as shown in FIG. 3. The device is considered to have three separate responses: the first is the HRS, which may be modelled as a MIS capacitor; the second is as the cell switches from the HRS to LRS under an optical impulse with a constant electrical bias; and the third is in the LRS.

FIG. 13 provides an overview of the RRAM cell's structure, model and response to light as described above. The device is considered to have three separate responses. For each response, FIG. 13 shows, top-left, a schematic physical representation of the device producing that response; top-right an analogous electrical model of this response; and bottom, the current behaviour in this response (taken from a subfigure of FIG. 5). For the first response (top left), the RRAM cell is in the HRS and its electrical properties are modelled as a MIS capacitor which is seen to charge at the onset of illumination, and discharge upon the termination of illumination. The second response (right) occurs as the cell switches from the HRS to LRS under an optical impulse, in which a current initiates at the onset of illumination, and then is maintained after the termination of illumination. For the third (final) response (bottom left), the RRAM cell is in the LRS and its electrical properties are modelled as a resistor in series with an electron bath, and is seen to experience an increased current at the onset of illumination, this current then reverting to its initial level upon the termination of illumination.

In review, the optical activity of a RRAM device (cell) has been investigated by characterising ITO—silica—p-type silicon cells under a range of voltage and optical conditions. The RRAM cells were observed to respond to wavelengths in the range of 410 to 650 nm, but were unresponsive at 1152 nm. This responsivity follows the trend of a typical silicon photodiode. The light applied to the RRAM cells caused charging in the HRS state, photocurrent in the LRS state, and could be used to trigger a switch from the HRS state to the LRS state using (12±2) μJ of optical energy (if used in conjunction with a voltage bias). A negative correlation between the switch voltage $V_{SET}$ and applied laser power has been demonstrated using the 632.8 nm source (this was the most stable of the lasers utilised for the experiment).

Based on the data from these investigations, a model of a RRAM cell has been developed, in which the p-type silicon substrate is considered to provide the optically active region of the device. The off state (HRS) of the RRAM cell is modelled as a metal-insulator-semiconductor capacitor. Free carrier generation due to incident light gives rise in the model to the observed change in voltage across the RRAM cell, and this configuration also explains the capacitor-like charge and discharge currents observed in the HRS, and the light-activated switching from the HRS to the LRS.

The model further provides an explanation for the observed similarities between (i) the responsivity curve and cut off of a RRAM cell, and (ii) those of a silicon photo-detector. Using band theory, the MIS capacitor model is predicted to enter the inverted state when biased at 5.5 V, at which point the electric field across the device is expected to build exponentially, contributing to the non-linear IV response of the RRAM cell.

Accordingly, the present application describes switching resistors having optically active elements, i.e. light-activated (or light-triggered) switching resistors. Such devices provide the ability to use light to trigger the switching resistor to switch state. This facility has a number of significant potential applications. For example, in high speed computing applications, a significant bottleneck in optical computing designs is how to perform optical to electrical conversions. Utilising the light-activated switching resistors as described herein could allow for direct optical-electrical communication, significantly improving computation speed. This would also be useful in data centres, where signals require frequent conversion between optical and electrical domains. Further to this, the light-activated switching resistors as described herein may find use as a form of direct storage for optical signals in optical networks, which currently lack a long term optical memory device.

A different form of application for the optical activity of such switching resistors would be in combination the other RRAM traits of logic and learning [32] to perform light-reactive (light-sensitive) decision making. For example, the pupil of the eye dilates and constricts based on incident light without waiting for instruction from the brain. The optically active RRAM technology described herein is therefore a potential candidate for an artificial iris material.

In some of the implementations described above, the device includes a dielectric silica layer and a second electrode ITO layer that are inherently transparent to photons of the wavelengths used for optical illumination. This allows for a relatively straightforward configuration for the optical illumination, whereby the incident light is provided from above (according to the geometry described above), and passes through the second electrode 6 and the dielectric layer 4 before encountering, and being absorbed within, the first electrode 2. Note that having light incident in this direction may assist in the optical illumination forming charge-carriers (e.g. electrons) relatively near to the interface between the first electrode 2 and the dielectric 4—which in turn may help the electrons migrate into the dielectric layer 4 to facilitate the formation of conductive filaments.

In such a configuration or geometry, the dielectric layer and the second electrode layer might each have an attenuation of less than 5%, preferably less than 1%, for light used for the optical illumination. Such a relatively low attenuation can be achieved by suitable selection of a (largely) transparent material, having regard also to the thickness of the dielectric layer/second electrode as appropriate.

Other implementations may use a different geometry or configuration. For example, in some example implementations, the optically active semiconductor layer may be fabricated on top of the switching resistor array so that the light may be directly incident on it. Alternatively, the light may be input through the side or underside of the layered structure directly into the optically active layer. In some implementations, the (e.g.) silicon substrate may be constructed to act as a waveguide to help route the light to the relevant location. Accordingly, in some of these alternative configurations, the dielectric layer and/or the second electrode may not be transparent.

A light-activated switching resistor as described herein might be used to form a two input device which is responsive to (i) a voltage stimulus and (ii) a photon stimulus. This might, for example, give a positive output if the voltage input is high, or if the voltage input is lower, but there is compensating optical input. Another possible mode of operation is to maintain the device at a voltage slightly lower than the set voltage in darkness; this would then act as a switch which is turned on by the provision of a light input. Such an arrangement could also act (for example) as a light detector, whereby the light input would be obtained from the environment. A further possible configuration would have a cascade of switching resistors, whereby each resistor might be triggered by an optical and/or electrical signal from a previous row in the cascade. Such configurations could potentially be utilised to create various forms of sequential logic.

Thus a switching resistor is described herein comprising a dielectric layer disposed between a first electrode layer and a second electrode layer, the switching resistor having a high resistance state and a low resistance state. The switching resistor is responsive to a voltage bias, applied between the first electrode layer and the second electrode layer, exceeding a threshold to switch from the high resistance state to the low resistance state. The switching resistor is sensitive to photo-illumination to reduce said threshold.

In other words, in the absence of photo-illumination, e.g. in darkness (or weak ambient lighting), the switching resistor transitions from the high resistance state to the low resistance state when the applied voltage bias exceeds a first threshold. However, in the presence of photo-illumination, the switching resistor transitions from the high resistance state to the low resistance state when the applied voltage bias exceeds a second threshold, which is reduced compared to the first threshold.

This light-activation of the switching resistor has a number of benefits and applications. Thus allowing the switching resistor to switch at a lower voltage using photo-illumination helps to operate the switching resistor using less power and/or with a lower operating voltage, which may be attractive for mobile devices (for example).

Furthermore, if we have a switching resistor which is held in darkness in the high resistance state with an applied voltage intermediate the first and second thresholds, then this device can be caused to transition to the low resistance state by the application of sufficient photo-illumination to reduce the current threshold level to the second threshold level, below the currently applied voltage bias. In some cases, this optically-triggered switching may be utilised as a form of optical sensor (e.g. light detector) to measure or detect photo-illumination from a light source external to the device. In other cases, the photo-illumination may be generated internally to the device or overall system, e.g. by a laser or a light-emitting diode (LED), which may then be used as a mechanism for controlling the switching of the switching resistor from the high resistance state to the low resistance state.

Note that references herein to a voltage being lower than a threshold imply that the magnitude of the voltage is smaller than the magnitude of the threshold (and conversely a voltage exceeds a threshold if the magnitude of the voltage is greater than the magnitude of the threshold). Nevertheless, some devices may be sensitive to the polarity of the voltage.

For example, some devices may have a different switching threshold according to whether a positive or negative voltage bias is applied, while some devices may require a particular polarity (positive or negative) for the applied voltage in order to transition from the high resistance state to the low resistance state. In addition, in some implementations, the switching threshold may potentially be better expressed as a current threshold, rather than as a voltage threshold (or by using any other suitable electrical parameter).

It is believed (without being bound by theory) that free carriers are generated in the switching resistor in response to photo-illumination of the switching resistor. The free carriers are typically free electrons (holes may also be generated, but the free electrons are believed to be more significant for the light-activated switching, at least in a p-doped silicon electrode layer). The free carriers may be generated in the first or second electrode layer (or potentially both) and migrate into the dielectric layer in response to the voltage bias. The free carriers facilitate the formation of at least one conductive filament in the dielectric layer to switch from the high resistance state to the low resistance state. For example, the free carriers may act to create Frenkel pairs in the dielectric layer, each Frenkel pair representing an oxygen vacancy and oxygen interstitial ion, whereby the oxygen vacancies facilitate the formation of the at least one conductive filament in the dielectric layer. However, it is possible that other mechanisms are at least partly responsible for the photo-illumination reducing the voltage threshold for switching to the low resistance state.

In some implementations, the first electrode layer comprises p-type silicon, which may, for example, be used to provide a substrate on which the switching resistor is formed. The dielectric layer is an oxide of silicon ($SiO_x$), for example, silicon dioxide. The second electrode layer comprises indium tin oxide (ITO). Note that such a dielectric layer and second electrode layer (formed of ITO) may be transparent, thereby supporting photo-illumination of the first electrode layer through the dielectric layer and the second electrode layer (which are both located above the first electrode layer). It will be appreciated however that these are just examples of suitable materials that may be utilised, and that various other materials may be used as appropriate. Furthermore, some implementations may utilise an opaque (non-transparent) second electrode layer and/or dieletric layer—for example, if the free carriers are being generated in the second electrode layer, or if the photo-illumination is provide to the first electrode layer via some other route, i.e. not through the second electrode layer and/or dieletric layer, e.g. through the sides or underside of the first electrode layer. In some cases, the first electrode layer may be suitably structured with channels, waveguides and/or vias (for example) to provide a path for the optical illumination to enter the first electrode layer.

In some implementations, the photo-illumination is within the wavelength range between 300 nm and 1500 nm, preferably in the wavelength range between 500 nm and 1000 nm, and preferably in the wavelength range between 600 nm and 9000 nm. Note that the particular choice of wavelength range may depend on the material (e.g. within the first electrode layer) that provides the optical activity of the switching resistor. The photo-illumination may be provided by a wide-band and/or narrow-band source (e.g. laser) as appropriate. In general, lasers may be able to provide a higher incident light radiation onto the first electrode (or other optically active element), which in turn can help to provide a greater reduction in the voltage threshold for switching. For example, the voltage threshold to switch from the high resistance state to the low resistance state may be lowered by at least 0.1V, in some cases by at least 0.3V, in some cases by at least 0.5V in response to the photo-illumination of the switching resistor, whereby the greater voltage threshold reductions may be achieved by using a higher intensity of incident light.

Also described herein is an optical device, and a method for operating such an optical device, which comprises a switching resistor as set out above. The method comprising biasing the switching resistor below said voltage threshold, with the switching resistor in the high resistance state; and generating photo-illumination of the switching resistor, for example by using a laser or LED included within the device, to trigger the switching resistor to transition into the low resistance state. The generation of the photo-illumination can be controlled by a suitable control facility to trigger the switching of the switching resistor as desired.

Also described herein is an optical sensor, and a method for operating such an optical sensor, which comprises a switching resistor as set out above. The method comprises biasing the switching resistor (in darkness) below said voltage threshold, with the switching resistor in the high resistance state. Light is received to provide photo-illumination of the switching resistor, thereby causing the switching resistor to transition into the low resistance state. This transition can then be used to detect and/or sense the received light.

In some cases, the optical sensor may comprise multiple switching resistors (cells), whereby different switching resistors have a bias voltage which is at a different (known) level below the switching threshold (in darkness). An optical input of a given intensity, which is provided to all of the cells, will produce a reduction in threshold level corresponding to this given intensity (see FIG. 7). This in turn will switch those cells for which the applied bias voltage is now above the (reduced) threshold voltage, but will not switch those cells for which the applied bias voltage remains below the (reduced) threshold voltage. The intensity of the optical illumination can then be determined from lowest applied voltage level which switches and/or the highest applied voltage level which does not switch.

In some cases, a switching resistor such as described herein (whether acting as an optical sensor or otherwise) may have multiple optical inputs. The switching resistor may be configured to switch into the LRS if one or more of the optical inputs is illuminated (analogous to an OR gate). Alternatively, the switching resistor may be biased at a lower level (compared to the switching threshold in darkness), such that it will only switch if all of the optical inputs are illuminated (analogous to an AND gate), given that that optical inputs are additive to provide a greater level of illumination, and hence a greater lowering of the switching threshold (see FIG. 7). Many other arrangements are possible—e.g. triggering if certain subsets of the optical inputs are illuminated (N.B. different inputs may provide different levels of illumination). In physical terms, the different inputs may have different paths, e.g. one input is provided through the second (upper) electrode, analogous to the geometry of FIG. 10a, and another input provided directly to the (optically active) first (lower) electrode. It is also possible for two or more inputs to share the same physical path, e.g. by providing two sources of illumination through the second electrode (since light signals are generally additive in intensity). Furthermore, the addition of the light signals may occur prior to the switching resistor itself—e.g. the switching resistor has a single optical fibre as input for photo-illumination, but multiple sources may contribute to (or regulate or set) the level of optical signal transmitted by this single optical fibre.

In some implementations therefore, light from the photo-illumination is generally absorbed by the first and/or second electrode (rather than within the dielectric layer itself). Absorbing light in this manner lowers the voltage required to transition to the low resistance state when electroforming and/or setting the switching resistor. A voltage bias causes an electric field across the dielectric layer, and the electric field typically retains approximately the same voltage level with or without the photo-illumination. The combination of the photo-illumination and an electric field applied to the switching resistor causes the switching resistor to transition to the low resistance state. The transition to the low resistance state typically occurs on a timescale of less than one millisecond, preferably less than 1 microsecond, preferably of the order of nanoseconds (e.g. in the range 0.1-100 nanoseconds). At least one of the first and/or second electrodes, i.e. the one(s) subject to photo-illumination, may be in direct contact with the dielectric layer (without no intervening layer(s)) to support the transfer of electrons, created by the photo-illumination, from the electrode into the dielectric layer.

In conclusion, the skilled person will be aware of various modifications that can be made to the above examples to reflect the particular circumstances of any given implementation. Moreover, the skilled person will be aware that features from different examples can be mixed as appropriate in any particular implementation, without limitation to the particular combinations described in the above examples. Accordingly, the scope of the present invention is defined by the appended claims and their equivalents.

REFERENCES

1. R. Waser, M. Aono, Nature materials 6.11, 833-840 (2007).
2. A. C. Torrezan, J. P. Strachan, G. Medeiros-Ribeiro, and R. S. Williams, Nanotechnology, 22(48), 485203 (2011).
3. H. Y. Chen, S. Yu, B. Gao, P. Huang, J. Kang, and H-SP Wong, IEEE International Electron Device Meeting (IEDM), 20.7.1-20.7.4 (2012).
4. S. H. Jo, T. Chang, I. Ebong, B. B. Bhadviya, P. Mazumder, W. Lu. Nano letters, 10.4, 1297-1301 (2010).
5. A. Mehonic, A. J. Kenyon, Frontiers in neuroscience, 10, 57 (2016).
6. J. Borghetti, G. S. Snider, P. J. Kuekes, J. J. Yang, D. R. Stewart, R. S. Williams, Nature, 464.7290, 873-876 (2010).
7. K. C. Chang, T. M. Tsai, T. C. Chang, H. H Wu, J. H. Chen, Y. E. Syu, G. W. Chang, T. J. Chu, G. R. Liu, Y. T. Su, M. C. Chen, IEEE Electron Device Letters, 34(3), 399-401 (2013).
8. A. Mehonic, A. J. Kenyon, Defects at Oxide Surfaces, Springer International Publishing, 401-428 (2015).
9. A. Mehonic, S. Cueff, M. Wojdak, S. Hudziak, O. Jambois, C. Labbé, B. Garrido, R. Rizk, A. J. Kenyon, Journal of Applied Physics, 111, 074507 (2012).
10. A. Mehonic, M. Buckwell, L. Montesi, L. Garnett, S. Hudziak, S. Fearn, R. Chater, D. McPhail, A. J. Kenyon, Journal of Applied Physics. 117.12, 124505 (2015).
11. A. N. Mikhaylov, A. I. Belov, D. V. Guseinov, D. S. Korolev, I. N. Antonov, D. V. Efimovykh, S. V. Tikhov, A. P. Kasatkin, O. N. Gorshkov, D. I. Tetelbaum, E. G. Gryaznov, A. P. Yatmanov, Materials Science and Engineering B, 194, 48 (2015).
12. J. Yao, Z. Sun, L. Zhong, T. D. Natelson, J. M. Tour, Nano letters. 10, 4105 (2010).
13. G. Wang, Y. Yang, J. H. Lee, V. Abramova, H. Fei, G. Ruan, E. L. Thomas, J. M. Tour. Nano letters. 14(8), 4694-9 (2014).
14. X. Yan, Z. Zhou, B. Ding, J. Zhao, Y. Zhang Y, Journal of Materials Chemistry C, Advance Article, (2017). DOI: 10.1039/C6TC04261A
15. A. Hohl, T. Wieder, P. A. van Aken, T. E. Weirich, G. Denninger, M. Vidal, S. Oswald, C. Deneke, J. Mayer and H. Fuess, Journal of Non-Crystalline Solids, 320(1), 255-280 (2003).
16. J. A. Thornton, Journal of Vacuum Science & Technology A: Vacuum, Surfaces, and Films, 4(6), 3059-3065 (1986).
17. S. J. Pennycook, D. E. Jesson, Ultramicroscopy, 37, no. 1: 14-38 (1991).
18. A. Mehonic, M. Wojdak, S. Hudziak, R. Rizk, R, A. J. Kenyon, Nanotechnology, 23(45), 455201 (2012).
19. T. M. Tsai, K. C. Chang, T. C. Chang G. W. Chang, Y. E. Syu, Y. T. Su, G. R. Liu, K. H. Liao, M. C. Chen, H. C. Huang, Y. H. Tai, D. S. gan, C. Ye, H. Wang, and S. M. Sze, IEEE Electon Device Lett. 33(12), 1693 (2012).
20. B. J. Choi, A. C. Torrezan, K. J. Norris, F. Miao, J. P. Strachan, M. X. Zhang, D. A. A. Ohlberg, N. P. Kobayashi, J. J. Yang, and R. S. Williams, Nano let. 13(7), 3213 (2013).
21. S. Tappertzhofen, H. Mundelein, I. Valov, and R. Waser, Nanoscale 4(10), 3040-3043 (2012).
22. D. R. Lamb and P. C. Rundle, Br. J. Appl. Phys. 18, 29 (1967).
23. C. M. Osburn and D. W. Ormond, J. Electrochem. Soc. 119, 691 (1972).
24. A. D. Pearson and C. E. Miller, Appl. Phys. Lett. 14, 280 (1969).
25. Y. Wang, Y. Chen, F. Xue, F. Zhou, Y. Chang, B. Fowler, and J. Lee, Appl. Phys. Let. 100, 083502 (2012).
26. K. Yeo, S. Nakao, Y. Hirose, T. Hasegawa, Y. Matsuo, Organic Electronics 14 1715-1719 (2013).
27. Sze, S. M. and Kwok, K., Physics of Semiconductor Devices, Third Edition, Wiley, (2007).
28. R. Southwick III, W. Knowlton, IEEE TDMR 6(2) 136-145 (2006)
29. R. Southwick III, A. Jain, W. Knowlton, IEEE TDMR 11(2) 236-243 (2006)
30. A. Vescan, W. Ebert, T. Borst, E. Kohn, Diamond and Related Materials 4 661-665 (1995).
31. A. Di Bartolomeo, Physics Reports 606 1-58 (2016).
32. S. Kvatinsky, G Wald, E. Friedman, A. Kolodny, U. C. Weiser, IEEE VLSI Sys. 22(10) 2054-2066 (2014).
33. Strukov et al, Nature, 453, 80-83, (2008).

The invention claimed is:

1. A switching resistor comprising a dielectric layer disposed between a first electrode layer, the first electrode layer comprising a p-type semiconductor or an n-type semiconductor, and a second electrode layer, wherein the dielectric layer is an oxide of silicon, the switching resistor having a high resistance state and a low resistance state; the switching resistor being responsive to a voltage bias, applied between the first electrode layer and the second electrode layer, exceeding a threshold to switch from the high resistance state to the low resistance state, wherein the first electrode layer comprises a substrate configured to absorb photo-illumination to generate free carriers, and wherein said switching resistor is sensitive to photo-illumination to reduce said threshold.

2. The switching resistor of claim 1, wherein, the free carriers are free electrons.

3. The switching resistor of claim 1, wherein the free carriers migrate into the dielectric layer in response to the voltage bias.

4. The switching resistor of claim 3, wherein the free carriers facilitate the formation of at least one conductive filament in the dielectric layer to switch from the high resistance state to the low resistance state.

5. The switching resistor of claim 4, wherein the free carriers act to create Frenkel pairs in the dielectric layer, each Frenkel pair representing an oxygen vacancy and oxygen interstitial ion, and wherein the oxygen vacancies facilitate the formation of the at least one conductive filament in the dielectric layer.

6. The switching resistor of claim 1, wherein the first electrode layer comprises p-type silicon.

7. The switching resistor of claim 1, wherein the photo-illumination is within the wavelength range between 300 nm and 1500 nm, preferably in the wavelength range between 500 nm and 1000 nm, and preferably in the wavelength range between 600 nm and 900 nm.

8. The switching resistor of claim 1, wherein the free carriers are free electrons, and wherein the dielectric layer and the second electrode layer are transparent to support photo-illumination of the first electrode layer.

9. The switching resistor of claim 8, wherein at least one of the second electrode layer and the dielectric layer attenuates less than 5%, preferably less than 1%, of the photo-illumination.

10. The switching resistor of claim 1, wherein said voltage threshold to switch from the high resistance state to the low resistance state is lowered by at least 0.1V, in some cases by at least 0.3V, in some cases by at least 0.5V in response to the photo-illumination of the switching resistor.

11. The switching resistor of claim 1, wherein light from the photo-illumination lowers the voltage required to transition to the low resistance state when electroforming and/or setting the switching resistor.

12. The switching resistor of claim 1, wherein the first and second electrodes are in direct contact with the dielectric layer without any intervening layers.

13. The switching resistor of claim 1, wherein the voltage bias causes an electric field across the dielectric layer, and the electric field has approximately the same voltage with or without the photo-illumination.

14. A method for operating a switching resistor comprising a dielectric layer disposed between a first electrode layer, the first electrode layer comprising a p-type semiconductor or an n-type semiconductor, and a second electrode layer, wherein the dielectric layer is an oxide of silicon, the switching resistor having a high resistance state and a low resistance state; the switching resistor being responsive to a voltage bias, applied between the first electrode layer and the second electrode layer, exceeding a threshold to switch from the high resistance state to the low resistance state, wherein the first electrode layer comprises a substrate configured to absorb photo-illumination to generate free electrons, and wherein said switching resistor is sensitive to photo-illumination to reduce said threshold, the method comprising:

biasing the switching resistor below said voltage threshold, with the switching resistor in the high resistance state; and generating photo-illumination of the switching resistor to trigger the switching resistor to transition into the low resistance state.

15. A method for operating an optical sensor comprising a switching resistor comprising a dielectric layer disposed between a first electrode layer, the first electrode layer comprising a p-type semiconductor or an n-type semiconductor, and a second electrode layer, wherein the dielectric layer is an oxide of silicon, the switching resistor having a high resistance state and a low resistance state; the switching resistor being responsive to a voltage bias, applied between the first electrode layer and the second electrode layer, exceeding a threshold to switch from the high resistance state to the low resistance state, wherein the first electrode layer comprises a substrate configured to absorb photo-illumination to generate free electrons, and wherein said switching resistor is sensitive to photo-illumination to reduce said threshold, the method comprising:

biasing the switching resistor below said voltage threshold, with the switching resistor is in the high resistance state; and receiving light to provide photo-illumination of the switching resistor, such that the switching resistor transitions into the low resistance state, thereby detecting the received light.

\* \* \* \* \*